United States Patent
Fan et al.

(10) Patent No.: US 11,947,889 B2
(45) Date of Patent: Apr. 2, 2024

(54) CHIPS PLACED IN FULL-CUSTOM LAYOUT AND ELECTRONIC DEVICE FOR IMPLEMENTING MINING ALGORITHM

(71) Applicant: SHENZHEN MICROBT ELECTRONICS TECHNOLOGY CO., LTD., Guangdong (CN)

(72) Inventors: Zhijun Fan, Guangdong (CN); Zuoxing Yang, Guangdong (CN); Nan Li, Guangdong (CN); Wenbo Tian, Guangdong (CN); Weixin Kong, Guangdong (CN)

(73) Assignee: SHENZHEN MICROBT ELECTRONICS TECHNOLOGY CO., LTD., Guangdong (CN)

(*) Notice: Subject to any disclaimer, the term of this patent is extended or adjusted under 35 U.S.C. 154(b) by 17 days.

(21) Appl. No.: 18/011,699

(22) PCT Filed: Jan. 10, 2022

(86) PCT No.: PCT/CN2022/070921
§ 371 (c)(1),
(2) Date: Dec. 20, 2022

(87) PCT Pub. No.: WO2022/166528
PCT Pub. Date: Aug. 11, 2022

(65) Prior Publication Data
US 2023/0195990 A1    Jun. 22, 2023

(30) Foreign Application Priority Data
Feb. 8, 2021 (CN) .......................... 202110180554.4

(51) Int. Cl.
*G06F 30/00* (2020.01)
*G06F 30/327* (2020.01)
(Continued)

(52) U.S. Cl.
CPC .......... *G06F 30/392* (2020.01); *G06F 30/327* (2020.01); *G06F 30/39* (2020.01)

(58) Field of Classification Search
CPC ....... G06F 30/392; G06F 30/39; G06F 30/327
See application file for complete search history.

(56) References Cited

U.S. PATENT DOCUMENTS

| 5,883,814 A | 3/1999 | Luk et al. |
| 10,719,650 B1 | 7/2020 | Sanders et al. |

(Continued)

FOREIGN PATENT DOCUMENTS

| CN | 1951103 B | * 1/2013 | ........... H04N 3/1562 |
| CN | 111651402 A | 9/2020 | |

(Continued)

OTHER PUBLICATIONS

International Search Report and Written Opinion dated Mar. 1, 2022 in International Application No. PCT/CN2022/070921.
Office Action dated Oct. 27, 2011 in Taiwanese Patent Application No. 111100932.

*Primary Examiner* — Naum Levin
(74) *Attorney, Agent, or Firm* — Venable LLP

(57) ABSTRACT

The present disclosure relates to a chip placed in a full-custom layout and an electronic device for implementing a mining algorithm. There is provided a chip placed in a full-custom layout, comprising a pipeline structure having a plurality of operation stages, wherein each operation stage includes: a plurality of rows arranged sequentially in an X-direction parallel to a substrate of the chip and having a uniform row height in the X-direction, the plurality of rows including rows of a first type, each row of the first type including: a first set of register modules; and a first set of logical operation modules; wherein the first set of register modules and the first set of logical operation modules are (Continued)

adjacently provided in a Y-direction, and the first set of logical operation modules is used for processing data in the first set of register modules.

14 Claims, 9 Drawing Sheets

(51) Int. Cl.
    *G06F 30/39*     (2020.01)
    *G06F 30/392*     (2020.01)

(56) References Cited

U.S. PATENT DOCUMENTS

| | | | |
|---|---|---|---|
| 11,579,875 B2 * | 2/2023 | Xu | G06F 30/32 |
| 2004/0230696 A1 * | 11/2004 | Barach | H04L 69/22 |
| | | | 709/238 |
| 2013/0174113 A1 | 7/2013 | Lecler et al. | |
| 2022/0271753 A1 | 8/2022 | Xue et al. | |

FOREIGN PATENT DOCUMENTS

| | | | | |
|---|---|---|---|---|
| CN | 212515800 U | | 2/2021 | |
| CN | 213042269 U | * | 4/2021 | ............... G06F 7/57 |
| CN | 214670605 U | | 11/2021 | |
| TW | 364977 B | | 7/1999 | |
| WO | 2014105868 A1 | | 7/2014 | |
| WO | 2018067719 A2 | | 4/2018 | |

* cited by examiner

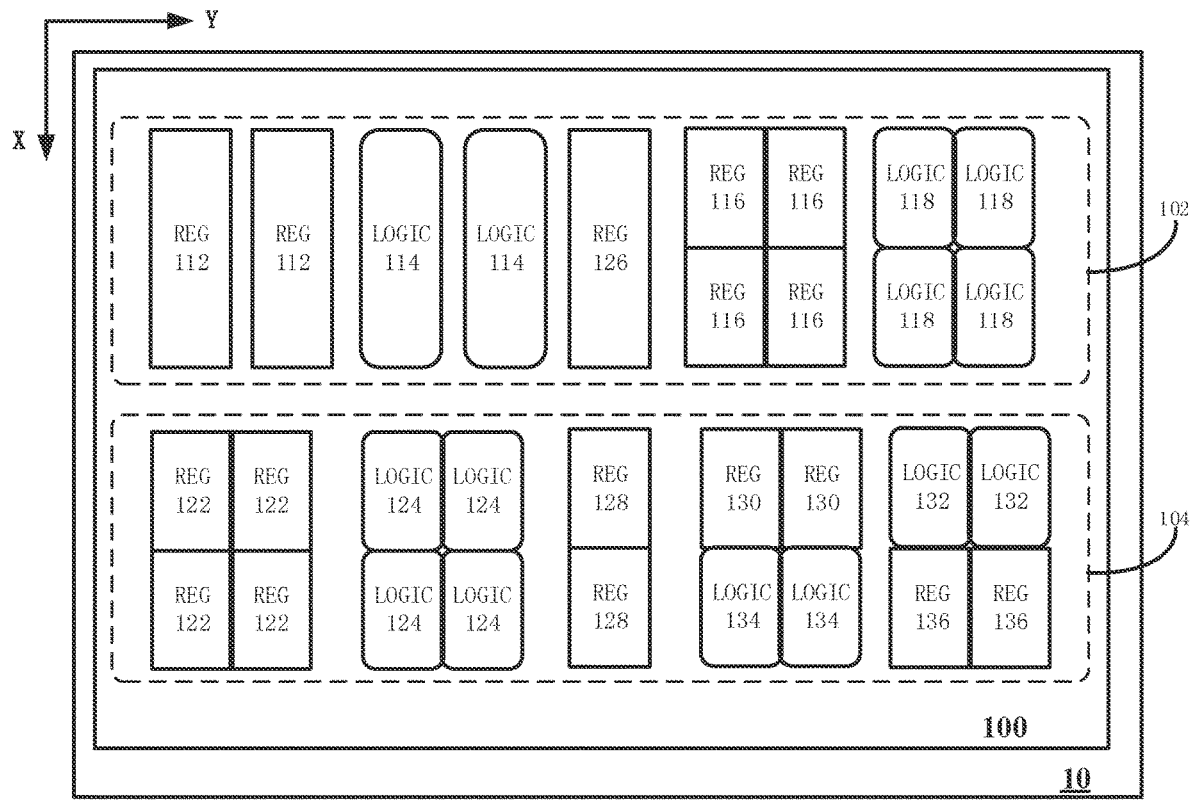
FIG. 1A
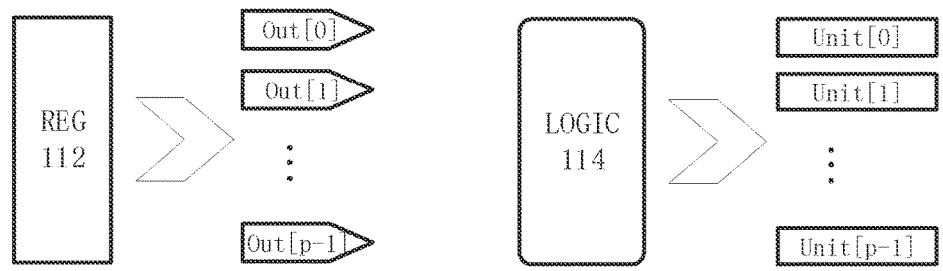
FIG. 1B
FIG. 1C

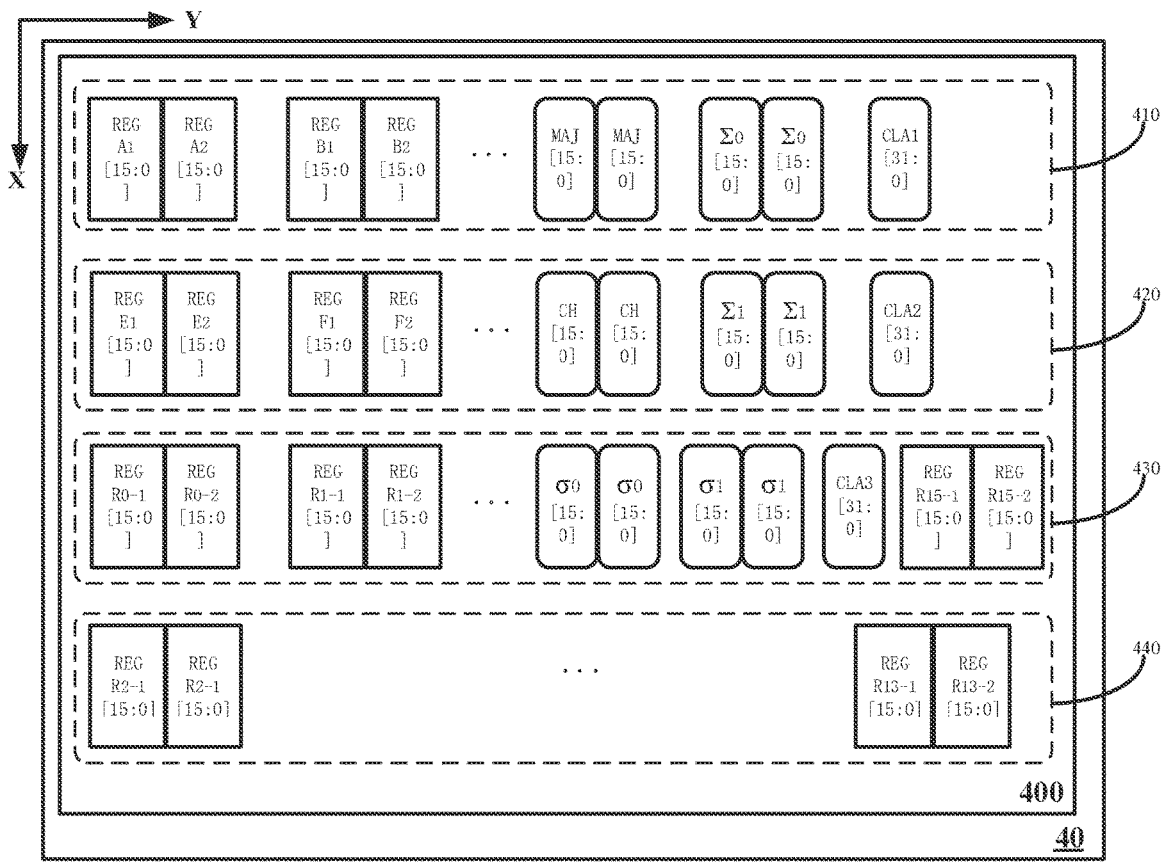
FIG. 8A
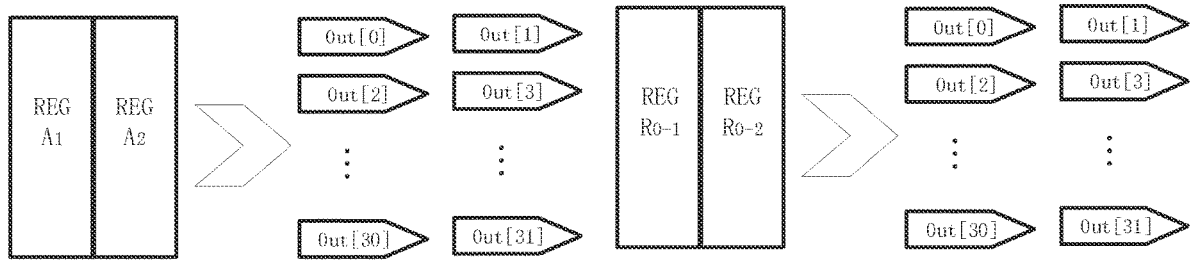
FIG. 8B
FIG. 8C
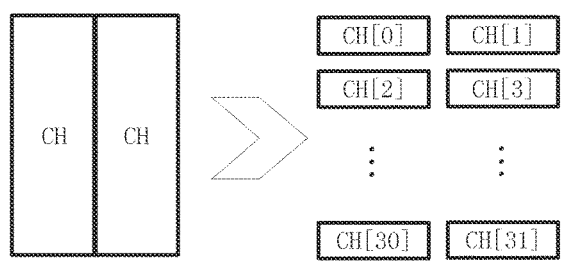
FIG. 8D

US 11,947,889 B2

CHIPS PLACED IN FULL-CUSTOM LAYOUT AND ELECTRONIC DEVICE FOR IMPLEMENTING MINING ALGORITHM

CROSS-REFERENCE TO RELATED APPLICATIONS

The present application is a National Stage Entry of International application No. PCT/CN2022/070921 filed on Jan. 10, 2022, which claims the priority to Chinese Patent Application No. 202110180554.4, filed on Feb. 8, 2021 and entitled "CHIP PLACED IN FULL-CUSTOM LAYOUT AND ELECTRONIC DEVICE FOR IMPLEMENTING MINING ALGORITHM", which is incorporated in its entirety herein by reference.

TECHNICAL FIELD

The present disclosure relates generally to chips placed in a full-custom layout, and more particularly, to electronic devices for implementing a mining algorithm comprising the chips placed in a full-custom layout.

BACKGROUND

Conventional Auto Place and Route (APR) technology generally employs Electronic Design Automation (EDA) synthesis tools to perform synthesis and Place & Route (P&R) of cells. The synthesis of APR refers to automatic conversion of RTL code into a netlist that consists of cells, the specific cells being provided by a library; Place and Route of APR (APR PR) refers to automatic placement of cells according to RULEs, which include but are not limited to: the cells cannot be overlapped, data interconnection relationships should be as close as possible, routing should be short, round-trip routing should be avoided as much as possible, and the like.

SUMMARY

The present disclosure achieves a chip with better performance by using a full-custom layout placement, including but not limited to making the chip smaller in area, shorter in the critical path, and so forth. The chip placed in a full-custom layout has the outstanding characteristic that the design of the chip is realized through manual code optimization and manual coding, without necessity of using EDA synthesis tools, and therefore the chip with the expected layout can be directly obtained, so that the performance of the chips is greatly optimized.

According to a first aspect of the present disclosure, there is provided a chip placed in a full-custom layout, comprising a pipeline structure having a plurality of operation stages, wherein each operation stage includes: a plurality of rows arranged sequentially in an X-direction parallel to a substrate of the chip and having a uniform row height in the X-direction, the plurality of rows including rows of a first type, each row of the first type including: a first set of register modules, including a*b register modules arranged in the form of an array of a rows and b columns, wherein each register module has a first height in the X-direction, and the row height is a times of the first height, where a and b are positive integers; and a first set of logical operation modules, including a*c logical operation modules arranged in the form of an array of a rows and c columns, wherein each logical operation module has the first height in the X-direction, where c is a positive integer; wherein the first set of register modules and the first set of logical operation modules are adjacently provided in a Y-direction, and the first set of logical operation modules is used for processing data in the first set of register modules.

According to a second aspect of the present disclosure, there is provided an electronic device for implementing a mining algorithm, comprising the chip placed in a full-custom layout as described above.

The chips placed in a full-custom layout proposed by the present disclosure have an optimized effect for chips that do not use SRAMs or only use a small amount of SRAMs, and are especially suitable for use as chips that need to use a large number of registers, such as mining machine chips. The mining machine chips are based on Hash algorithm, which (e.g., MD5, SHA-256, etc.) typically employ a large number of registers to store multi-bit data. For example, MD5 is based on at least 4 32-bit data, and SHA-256 is based on at least 8 32-bit data. Taking a Bitcoin mining machine chip as an example, it is based on SHA-256 algorithm with multiple repeated calculation processes, so a pipeline structure is usually adopted to realize the multiple repeated calculation processes, and each operation stage of the pipeline structure includes registers and combinational logic to process at least 8 32-bit data. Based on this, the performance of a Bitcoin mining machine can be effectively improved by implementing the Bitcoin mining machine using the chip placed in a full-custom layout proposed in the present disclosure.

Other features and advantages of the present disclosure will become apparent through following detailed descriptions of the illustrative embodiments of the present disclosure with reference to the accompanying drawings.

BRIEF DESCRIPTION OF THE DRAWINGS

The drawings, which constitute a part of this description, illustrate embodiments of the present disclosure and together with the description, serve to explain the principles of the present disclosure.

The present disclosure may be more clearly understood from the following detailed description with reference to the drawings, in which:

FIG. 1A illustrates a schematic structural diagram of a chip 10 placed in a full-custom layout according to an embodiment of the present disclosure;

FIG. 1B illustrates a schematic structural diagram of a first set of register modules;

FIG. 1C illustrates a schematic structural diagram of at least part of the logical operation modules in a first set of logical operation modules;

FIG. 1D illustrates a schematic structural diagram of a second set of register modules;

FIG. 1E illustrates a schematic structural diagram of at least part of the logical operation modules in a second set of logical operation modules;

FIG. 1F illustrates a schematic structural diagram of a third set of register modules;

FIG. 1G illustrates a schematic structural diagram of at least part of the logical operation modules in a third set of logical operation modules;

FIG. 8A exemplarily illustrates a schematic structural diagram of a chip 40 placed in a full-custom layout for performing SHA-256 algorithm according to an embodiment of the present disclosure;

FIG. 8B illustrates a schematic structural diagram of two adjacent cache register modules $A_1$ and $A_2$;

FIG. 8C illustrates a schematic structural diagram of two adjacent extension register modules $R_{0-1}$ and $R_{0-2}$;

FIG. 8D illustrates a schematic structural diagram of two adjacent 16-bit CH modules;

Figure 2:
FIG. 2 illustrates an overall process of performing data processing and outputting a data digest of SHA-256.
Figure 2:
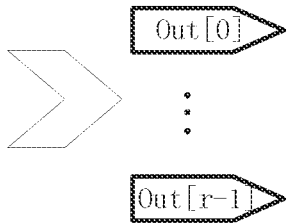
Figure 2:
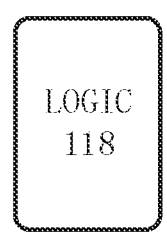
Figure 2:
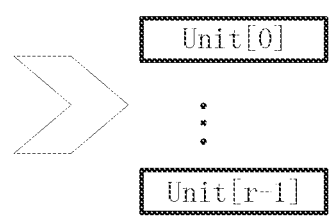
Figure 2:
Figure 2:
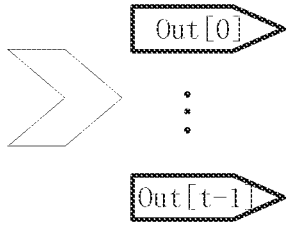
Figure 2:
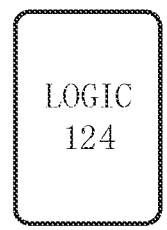
Figure 2:
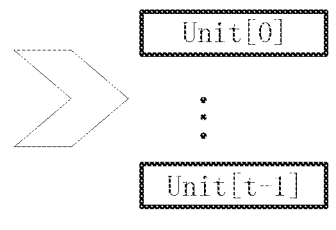
Figure 2:
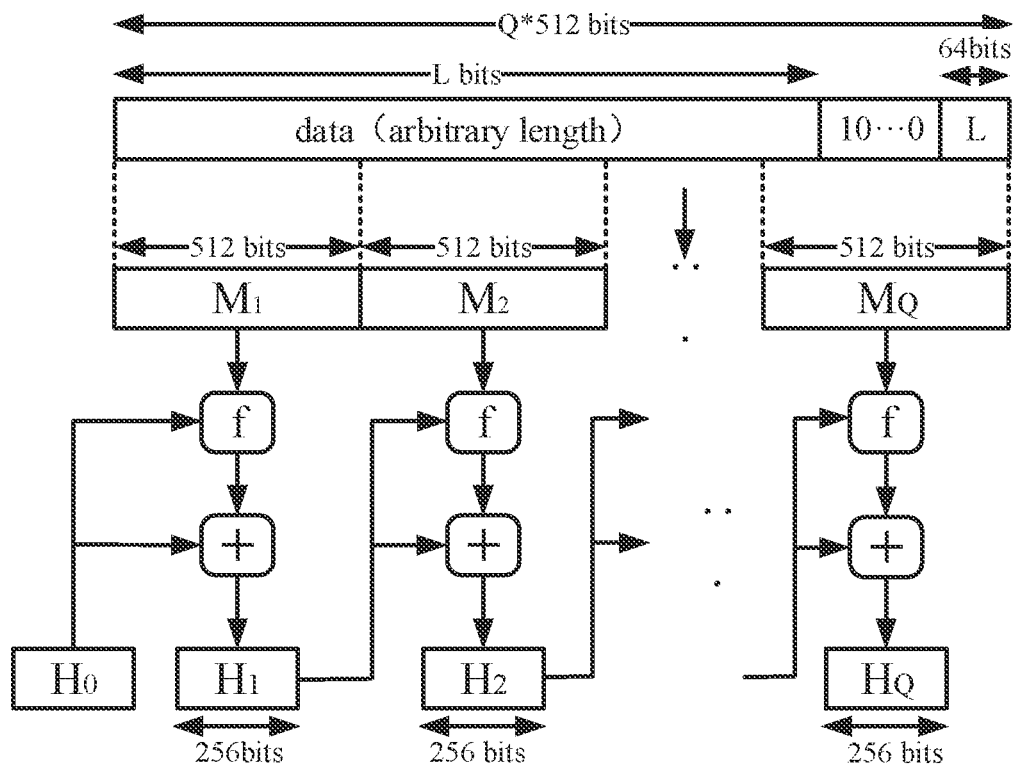

Note that in the embodiments described below, the same reference sign sometimes is used in common between different drawings to denote the same part or parts having the same function, with omission of repeated description thereof. In the description, similar marks and letters represent similar items, so once a certain item is defined in one figure, no further discussion on it is required in the following figures.

To facilitate understanding, the positions, sizes, ranges, and the like of the respective structures shown in the drawings and the like sometimes do not indicate actual positions, sizes, ranges, and the like. Therefore, the disclosed invention is not limited to the positions, sizes, ranges and the like as disclosed in the drawings and the like. Furthermore, the drawings are not necessarily drawn in proportion, and some features may be exaggerated to show details of particular components.

DETAILED DESCRIPTION

Various illustrative embodiments of the present disclosure will now be described in details with reference to the accompanying drawings. It shall be noted that unless otherwise illustrated, respective arrangements of the components and steps, mathematic expressions and values illustrated in these embodiments do not limit the scope of the present disclosure.

The following descriptions on at least one illustrative embodiment are actually merely illustrative, and by no means serve as any limitation on the present disclosure or its application or utilization. That is, the circuits and methods for implementing a hash algorithm herein are shown by way of examples to illustrate different embodiments of the circuits or methods in this disclosure and are not intended to be limiting. Those skilled in the art, however, will understand that they are merely illustrative, instead of exhaustive, of exemplary ways in which the present disclosure may be practiced.

Techniques, methods and devices that have already been known to ordinary technicians in the art may not be discussed here in detail, but under suitable circumstances, the techniques, methods and devices shall be deemed as parts of the granted description.

Although the conventional APR technology can greatly improve the design efficiency, it also brings some disadvantages. For example, if a designer describes a complex arithmetic expression with hierarchies using RTL code, and then performs Auto Place and Route on the expression using EDA synthesis tools, the resulting netlist is obtained by taking the whole arithmetic expression as a whole, which makes the hierarchies of the arithmetic expression cannot not be reflected, and the placement relationship of each cell therein is also uncontrollable. This will lead to a lot of redundancy and waste in the final Place & Route, which needs to be further optimized.

FIG. 1A illustrates a schematic structural diagram of a chip 10 placed in a full-custom layout according to an embodiment of the present disclosure. The chip 10 comprises a pipeline structure having a plurality of operation stages. For clarity, only one operation stage 100 of the pipeline structure is shown in FIG. 1A while other structures are omitted, but those skilled in the art will appreciate that the pipeline structure of the chip 10 may comprise any number of operation stages 100 and that the chip 10 may also comprise any other structures.

Each operation stage 100 of the pipeline structure of the chip 10 may comprise: a plurality of rows arranged sequentially in an X-direction parallel to a substrate of the chip and having a uniform row height in the X-direction. The plurality of rows may include row(s) of a first type, and each row of the first type may include: a first set of register modules, including a*b register modules arranged in the form of an array of a row(s) and b column(s), wherein each register module has a first height in the X-direction, and the row height is a times of the first height, where a and b are positive integers; and a first set of logical operation modules, including a*c logical operation modules arranged in the form of an array of a row(s) and c column(s), wherein each logical operation module has the first height in the X-direction, where c is a positive integer. The first set of register modules and the first set of logical operation modules may be adjacently provided in the Y-direction, and the first set of logical operation modules may be used to process data in the first set of register modules. Note that the expressions about the magnitude relationships of "height" mentioned herein are not intended to indicate strict magnitude relationships, but indicate approximate or rough magnitude relationships. For example, "the row height is a times of the first height" means that the row height is approximately a times of the first height, that is, a difference within an acceptable range between the actual row height and a times of the first height is allowed. For another example, "each logical operation module has a first height in the X-direction" means that the height of the logical operation module in the X-direction is approximately the first height, that is, a difference within an acceptable range between the height of the logical operation module in the X-direction and the first height is allowed. The acceptable range of the difference may be a general range acceptable in the art, or may be a range set as needed by a person skilled in the art that adopts the solution of the present disclosure.

For example, referring to FIG. 1A, a row 102 is one of row(s) of a first type, which includes a first set of register modules and a first set of logical operation modules. The first set of register modules of the row 102 includes 2 register modules 112 arranged in the form of an array of 1 row and 2 columns, i.e., a=1 and b=2; the first set of logical operation modules of the row 102 includes 2 logical operation modules 114 arranged in the form of an array of 1 row and 2 columns, i.e., c=2. It will be appreciated by those skilled in the art that the row 102 shown in FIG. 1A is only one example of a row of a first type and is not intended to be limiting, and that a, b, and c may all take on other values.

In some embodiments, each register module in the first set of register modules may be a p-bit register module, and is provided, on a side thereof close to the first set of logical operation modules, with p 1-bit data output ports arranged sequentially in the X-direction, where p is a positive integer. The first set of register modules may include q register modules provided sequentially in the Y-direction for collectively storing one data of p*q bits, where q is a positive integer and q is not greater than the number of columns of the first set of register modules and the number of columns of the first set of logical operation modules. Correspondingly, each of at least part of the logical operation modules in the first set of logical operation modules may include p 1-bit operation units arranged sequentially in the X-direction, and at least part of the logical operation modules in the first set of logical operation modules may include q logical operation modules provided sequentially in the Y-direction for collectively processing one or more data having a length of p*q bits. Specifically, when q=1, each of the first set of register modules is used for independently storing one p-bit data, and the first set of logical operation modules includes logical operation module(s) for independently processing one or more data having a length of p bits; when q>1, the first set of register modules includes q adjacent register modules provided sequentially in the Y-direction for collectively storing one data of p x q bits, and the first set of logical operation modules includes q adjacent logical operation modules provided sequentially in the Y-direction for collectively processing one or more data having a length of p*q bits.

FIG. 1B illustrates a schematic structural diagram of the first set of register modules. As shown in FIG. 1B, one of the first set of register modules 112 is a p-bit register module, and provided, on a side thereof close to the first set of logical operation modules, with p 1-bit data output ports Out[0] to Out[p−1] arranged sequentially in the X-direction.

FIG. 1C illustrates a schematic structural diagram of at least part of the logical operation modules in the first set of logical operation modules. As shown in FIG. 1C, one of at least part of the logical operation modules 114 in the first set of logical operation modules includes p 1-bit operation units Unit[0] to Unit[p−1] arranged sequentially in the X-direction.

In some embodiments, at least one of the row(s) of the first type may further include: a fifth set of register modules including a*m register modules arranged in the form of an array of a row(s) and m column(s), wherein each register module has a first height in the X-direction, and m is a positive integer. The first set of logical operation modules and the fifth set of register modules may be adjacently provided in the Y-direction, and the fifth set of register modules may be used to store data processed by the first set of logical operation modules.

For example, referring to FIG. 1A, the row 102 may include a fifth set of register modules. The fifth set of register modules may include one register module 126 arranged in the form of an array of 1 row and 1 column, i.e., m=1.

In some embodiments, at least one of the row(s) of the first type of the operation stage 100 may further include: a second set of register modules including d*e register modules arranged in the form of an array of d row(s) and e column(s), wherein each register module has a second height in the X-direction, and the row height is d times of the second height, where d and e are positive integers; and a second set of logical operation modules, including d*f logical operation modules arranged in the form of an array of d row(s) and f column(s), wherein each logical operation module has the second height in the X-direction, where f is a positive integer. The second set of register modules and the second set of logical operation modules are adjacently provided in the Y-direction, and the second set of logical operation modules is used for processing data in the second set of register modules.

For example, referring to FIG. 1A, row 102 may include a second set of register modules and a second set of logical operation modules. The second set of register modules of the row 102 may include 4 register modules 116 arranged in the form of an array of 2 rows and 2 columns, i.e., d=2 and e=2; the second set of logical operation modules of the row 102 may include 4 logical operation modules 118 arranged in the form of an array of 2 rows and 2 columns, i.e., f=2. It will be appreciated by those skilled in the art that the row 102 shown in FIG. 1A is only one example of a row of a first type and is not intended to be limiting, and that d, e, and f may all take on other values.

In some embodiments, each register module in the second set of register modules is an r-bit register module, and provided, on a side thereof close to the second set of logical operation modules, with r 1-bit data output ports arranged sequentially in the X-direction, where r is a positive integer and satisfies a*p=d*r. That is, the total number of bits that can be stored by the register modules in any column of the first set of register modules is the same as the total number of bits that can be stored by the register modules in any column of the second set of register modules, so that the row height of the first row is kept consistent. The second set of register modules may include s register modules arranged sequentially in the Y-direction for collectively storing one data of r*s bits, where s is a positive integer and is not greater than the number of columns of the second set of register modules and the number of columns of the second set of logical operation modules. Each of at least part of the logical operation modules in the second set of logical operation modules may include r 1-bit operation units arranged sequentially in the X-direction, and the at least part of the logical operation modules may include s logical operation modules arranged sequentially in the Y-direction for collectively processing one or more data having a length of r*s bits. Specifically, when s=1, each of the second set of register modules is used for independently storing one r-bit data, and the second set of logical operation modules includes logical operation module(s) for independently processing one or more data having a length of r bits; when s>1, the second set of register modules includes s adjacent register modules arranged sequentially in the Y-direction for collectively storing one data of r*s bits, and the second set of logical operation modules includes s adjacent logical operation modules arranged sequentially in the Y-direction for collectively processing one or more data having a length of r*s bits.

FIG. 1D illustrates a schematic structural diagram of the second set of register modules. As shown in FIG. 1D, one of the second set of register modules 116 is a r-bit register module, and provided, on a side thereof close to the second set of logical operation modules, with r 1-bit data output ports Out[0] to Out[r−1] arranged sequentially in the X-direction.

FIG. 1E illustrates a schematic structural diagram of at least part of the logical operation modules in the second set of logical operation modules. As shown in FIG. 1E, one of at least part of the logical operation modules 118 in the second set of logical operation modules include r 1-bit operation units unit[0] to Unit[r−1] arranged sequentially in the X-direction.

In some embodiments, the plurality of rows of the operation stage 100 may also include row(s) of a second type. Each row of the second type may include: a third set of register modules, including g*h register modules arranged in the form of an array of g row(s) and h column(s), wherein each register module has a third height in the X-direction, and the row height is g times of the third height, g and h being positive integers; and a third set of logical operation modules, including g*i logical operation modules arranged in the form of an array of g row(s) and i column(s), wherein each logical operation module has the third height in the X-direction, being a positive integer. The third set of register modules and the third set of logical operation modules are adjacently provided in the Y-direction, and the third set of logical operation modules is used for processing data in the third set of register modules.

For example, referring to FIG. 1A, a row 104 is one of the row(s) of the second type, which includes a third set of register modules and a third set of logical operation modules. The third set of register modules of the row 104 includes 4 register modules 122 arranged in the form of an array of 2 rows and 2 columns, i.e., g=2 and h=2; the third set of logical operation modules of the row 104 includes 4 logical operation modules 124 arranged in the form of an array of 2 rows and 2 columns, i.e., i=2. It will be appreciated by those skilled in the art that the row 104 shown in FIG. 1A is only one example of a row of a second type and is not intended to be limiting, and that g, h, and i may all take on other values.

In some embodiments, each register module in the third set of register modules may be a t-bit register module, and is provided, on a side thereof close to the third set of logical operation modules, with t 1-bit data output ports arranged sequentially in the X-direction, where t is a positive integer and satisfies a*p=g*t. That is, the total number of bits that can be stored by the register modules in any column of the first set of register modules in the row(s) of the first type is the same as the total number of bits that can be stored by the register modules in any column of the third set of register modules in the row(s) of the second type, so that the row height of the row(s) of the first type and the row height of the row(s) of the second type are kept consistent. The third set of register modules may include u register modules arranged sequentially in the Y-direction for collectively storing one data of t*u bits, where u is a positive integer and is not greater than the number of columns of the third set of register modules and the number of columns of the third set of logical operation modules. Correspondingly, each of at least part of the logical operation modules in the third set of logical operation modules may include t 1-bit operation units arranged sequentially in the X-direction, and at least part of the logical operation modules in the third set of logical operation modules may include u logical operation modules arranged sequentially in the Y-direction for collectively processing one or more data having a length of t*u bits. Specifically, when u=1, each of the third set of register modules is used for independently storing one t-bit data, and the third set of logical operation modules includes logical operation module(s) for independently processing one or more data having a length of t bits; when u>1, the third set of register modules may include u adjacent register modules arranged sequentially in the Y-direction for collectively storing one data of t*u bits, and the third set of logical operation modules includes u logical operation modules arranged sequentially in the Y-direction for collectively processing one or more data having a length of t*u bits.

FIG. 1F illustrates a schematic structural diagram of a third set of register modules. As shown in FIG. 1F, one of the third set of register modules 122 is a t-bit register module, which is provided, on a side thereof close to the third set of logical operation modules, with t 1-bit data output ports Out[0] to Out[t−1] arranged sequentially in the X-direction.

FIG. 1G illustrates a schematic structural diagram of at least part of the logical operation modules in the third set of logical operation modules. As shown in FIG. 1G, one of at least part of the logical operation modules 124 in the third set of logical operation modules include t 1-bit operation units Unit[0] to Unit[t−1] arranged sequentially in the X-direction.

In some embodiments, at least one of the row(s) of the second type may further include: a sixth set of register modules including g*n register modules arranged in the form of an array of g row(s) and n column(s), wherein each register module has a third height in the X-direction, n being a positive integer. The third set of logical operation modules and the sixth set of register modules may be adjacently provided in the Y-direction, and the sixth set of register modules may be used to store data processed by the third set of logical operation modules.

For example, referring to FIG. 1A, the row 104 may include a sixth set of register modules. The sixth set of register modules may include 2 register modules 128 arranged in the form of an array of 2 rows and 1 column, i.e., n=1.

In some embodiments, at least one of the plurality of rows of the operation stage 100 may include: a fourth set of modules including j*k modules arranged in the form of an array of j row(s) and k column(s), wherein each module may be a register module or a logical operation module and has a fourth height in the X-direction, and the row height is j times of the fourth height, where j and k are positive integers. That is, the row(s) of the first type, the row(s) of the second type, and the row(s) other than the rows of the first type and the row(s) of the second type may all include a fourth set of modules. Each module in the fourth set of modules can be arbitrarily set as a register module or a logical operation module, and thus, the fourth set of modules can be all register modules, all logical operation modules, or any combination of register modules and logical operation modules.

For example, referring to FIG. 1A, the row 104 of the second type may include a fourth set of modules. The fourth set of modules of the row 104 includes 8 modules arranged in the form of an array of 2 rows and 4 columns, i.e. j=2 and k=4. The 8 modules include register modules 130 and 136 and logical operation modules 132 and 134. It will be appreciated by those skilled in the art that the arrangement of the fourth set of modules shown in FIG. 1A is for illustration only and not intended to be limiting, and that other arrangements, such as alternate arrangements of register modules and logical operation modules, may also be used. For example, in some embodiments, two adjacent register modules 130 as shown in FIG. 1A may be 16-bit registers and are used to collectively store one 32-bit data; two adjacent logical operation modules 132 as shown in FIG. 1A may be 16-bit logical operation modules and are used to collectively process 32-bit data stored in the two register modules 130. In other embodiments, the two 16-bit register modules 130 for collectively storing one 32-bit data and the two logical operation modules 132 for collectively processing the 32-bit data stored in the two register modules 130 may be arranged alternately with each other, i.e., arranged sequentially in the order of a register module 130, a logical operation module 132, a second register module 130, and a second logical operation module 132 in the Y-direction.

According to the embodiment of the present disclosure, by keeping the row heights of all rows of each operation stage of the pipeline structure consistent, and adjacently disposing the register modules and the logical operation modules for processing data in the register modules, a very regular and tidy chip layout placement is realized. This effectively reduces the length and complexity of routing, so that the area utilization rate of the chip is improved, the critical path of the chip is shortened, and the overall performance of the chip is greatly improved.

Although FIG. 1A shows that the operation stage includes 2 rows and shows a specific structure of each row (e.g., the number of register modules, the number of logical operation modules, the placement order of different modules, etc.), those skilled in the art will appreciate that the chip 10 in FIG. 1A is simply used for illustration and not intended to be limiting in any way. Each operation stage of the pipeline structure of the chip placed in a full-custom layout according to the embodiment of the present disclosure may include any number of row(s) having a uniform row height in the X-direction, wherein the specific structure of the individual rows may be arbitrarily set according to application needs, and may include other structures besides the aforementioned register modules and/or logical operation modules, for example, an operation stage may include any combinations of the various different rows as shown in FIG. 1A. In application, a chip designer can adopt the full-custom layout placement described above to realize a complex algorithm with multiple hierarchies, so that the hardware realization of the algorithm can follow a preset hierarchical structure of the algorithm, thereby improving performance of the chip.

When a process for realizing a chip is determined, the height of a register module adopting the structure as described above (i.e., it is provided, on a side thereof, with several 1-bit data output ports arranged sequentially in the X-direction) in the X-direction depends on the scale of the register module, i.e., the number of bits that can be stored therein. Therefore, in the process of designing the chip, the scale of the register modules in each operation stage of the pipeline structure can be determined according to the algorithm to be realized firstly, and then the height of the adopted register modules in the X-direction can be determined according to the scale, so that the row height of each row of the operation stage in the X-direction can be determined. After that, logical operation modules with the same height in the X-direction are configured for each row, and finally, the chip placed in a full-custom layout as described above is implemented. Those skilled in the art will understand that the width of the respective rows of the operation stage 100 in the Y-direction according to the embodiment of the present disclosure may be arbitrarily set as needed, the number of register modules and the number of logical operation modules in the respective rows may be arbitrarily set as needed, the intervals between adjacent modules in the respective rows may be arbitrarily set as needed, and the widths of the register modules and the logical operation modules in the respective rows in the Y-direction may be arbitrarily set as needed.

In order to more clearly and intuitively present the inventive concepts of the present disclosure, SHA-256 algorithm will be briefly introduced below and an example of implementing the SHA-256 algorithm with a chip placed in a full-custom layout as proposed by the present disclosure will be described in detail. Those skilled in the art will appreciate that a chip placed in a full-custom layout according to an embodiment of the present disclosure may be used to implement various algorithms, including but not limited to hash algorithms (e.g., MD5, SHA-256, etc.), and is not limited to implementing the SHA-256 algorithm. Implementation of the SHA-256 algorithm is provided here for example purpose only and is not intended to constitute an additional limitation.

The input to SHA-256 is data with a maximum length of less than $2^{64}$ bits, and the output is a 256-bit data digest, i.e., a hash value. Input data is processed in units of 512-bit data blocks. FIG. 2 illustrates an overall process of SHA-256 performing data processing and outputting a data digest. This process includes steps 1 to 5 as described in detail later.

Step 1: append padding bits. Data with original length of L bits is padded, so that length of data modulo 512 is congruent with 448, that is, length=448 (mod 512). Even if the original data already meets the above length requirement, padding is still required, so the number of padding bits is between 1 and 512. The padding consists of one 1 and subsequent 0(s).

Step 2: append a length. A 64-bit unsigned integer is appended after the padded data, and the 64-bit unsigned integer indicates the length L of the data before padding.

The result of the foregoing Steps 1 and 2 is that extension data with a length of an integer multiple of 512 bits is generated, and the length of the extension data can be expressed as Q*512 bits, where Q is a positive integer greater than 1. As shown in FIG. 2, the extension data is divided into Q data blocks $M_1$, $M_2$ up to $M_Q$ each having a length of 512 bits.

Step 3: initialize a hash cache. The initial value $H_0$, intermediate values $H_1$, $H_2$ through $H_{Q-1}$, and the final result $H_Q$ of the hash algorithm are stored in sequence in a 256-bit hash cache, which may include 8 32-bit cache register modules A, B, C, D, E, F, G and H. At the start of the operation, the hash cache is first initialized to the initial value $H_0$, i.e., cache register modules A, B, C, D, E, F, G and H are respectively initialized to integers (hexadecimal) as shown in the following table.

| |
| --- |
| A = 0X7A09E667 |
| B = 0XBB67AE85 |
| C = 0X3C6EF372 |
| D = 0XA54FF53A |
| E = 0X510E527F |
| F = 0X9B05688C |
| G = 0X1F83D9AB |
| H = 0X5BE0CD19 |

Step 4: process data in units of data blocks of 512 bits. The core of SHA-256 is to perform round operation including 64 rounds of operations for each of the 512-bit data blocks $M_1$, $M_2$ through $M_Q$ in turn. The round operation is marked as fin FIG. 2.

Figure 3:
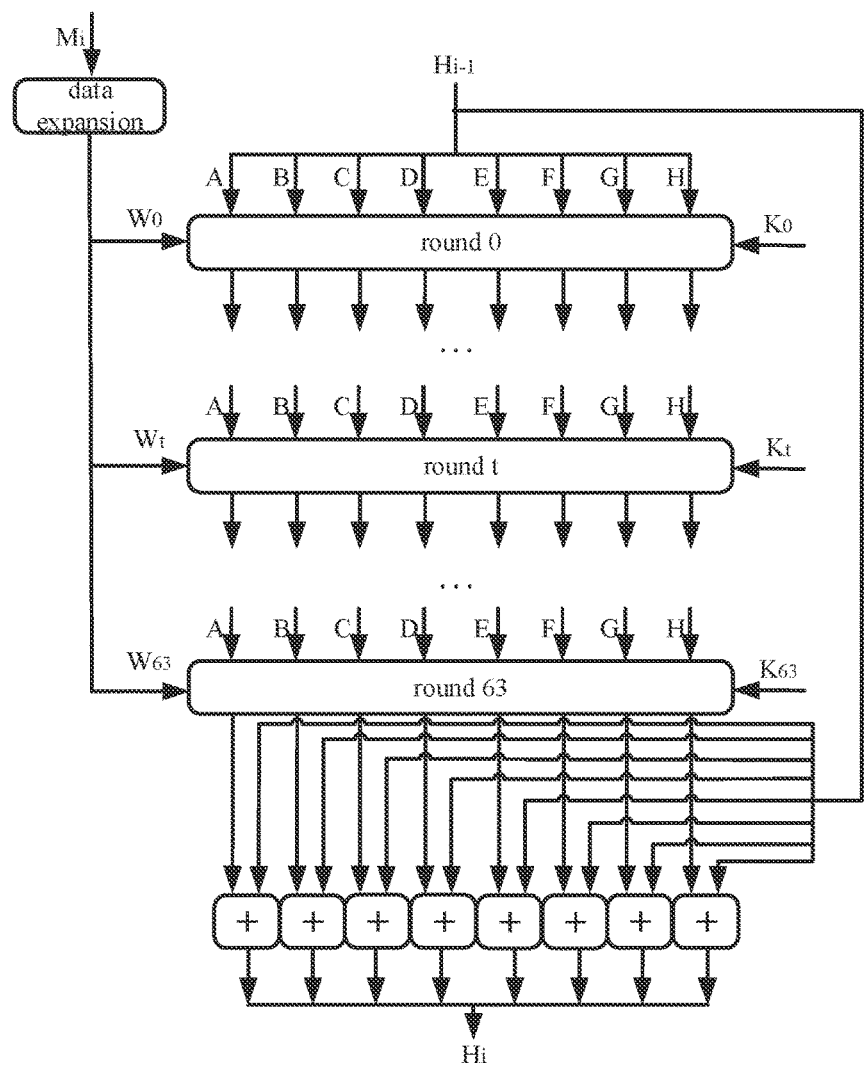
FIG. 3 illustrates an operation process of round operation of SHA-256.

FIG. 3 illustrates an operation process of a round operation of SHA-256. In each of the 64 rounds of operations of the round operation, the data in the cache register modules A to H of the hash cache are taken as input and the data in the cache register modules A to H of the hash cache are updated. In round 0 of the round operation on the data block $M_i$, the value in the hash cache is an intermediate value $H_{i-1}$, where i is a positive integer and i≤Q. In each round of the round operation on the data block $M_i$, such as round t (t is an integer and satisfies 0≤t≤63), a 32-bit value $W_t$ is used, which is derived from the current 512-bit data block $M_i$. The derivation algorithm is the data expansion algorithm that will be discussed below. Each round will also use an additional constant $K_t$ to make the operation different for each round. The output of round 63 and the input $H_{i-1}$ of round 0 are added to produce $H_i$, where the 32-bit data in each register of the cache register modules A to H in the hash cache and the corresponding 32-bit data in $H_{i-1}$ are subjected to an addition operation of modulo $2^{32}$.

Step 5: output. After all Q 512-bit data blocks have been processed, the output from the Q-th stage is a 256-bit data digest $H_Q$, i.e., a hash value.

The internal logic of each of the 64 rounds of operation of the round operations of SHA-256 is discussed in detail below. The operation of the round t is defined by the following expression (t is an integer and satisfies $0 \leq t \leq 63$):

$$T_1 = H + \Sigma_1(E) + CH(E,F,G) + K_t + W_t$$

$$T_2 = \Sigma_0(A) + MAJ(A,B,C)$$

$$H = G$$

$$G = F$$

$$F = E;$$

$$E = D + T_1$$

$$D = C$$

$$C = B$$

$$B = A$$

$$A = T_1 + T_2 \quad \text{(Expression 1)}$$

wherein:

$$CH(x,y,z) = (x \text{ AND } y) \oplus ((\text{NOT } x) \text{ AND } z)$$

$$MAJ(x,y,z) = (x \text{ AND } y) \oplus (x \text{ AND } z) \oplus (y \text{ AND } z)$$

$$\Sigma_0(x) = ROTR^2(x) \oplus ROTR^{13}(x) \oplus ROTR^{22}(x)$$

$$\Sigma_1(x) = ROTR^6(x) \oplus ROTR^{11}(x) \oplus ROTR^{25}(x)$$

wherein, $ROTR^n(x)$ represents circularly right shifting the 32-bit variable x by n bits; $W_t$ denotes a 32-bit word derived from the current 256-bit input data block; $K_t$ denotes a 32-bit additional constant; + denotes modulo 232 addition; AND denotes a 32-bit bitwise AND operation; NOT denotes an inversion operation; $\oplus$ denotes an Exclusive Or operation.

Figure 4:
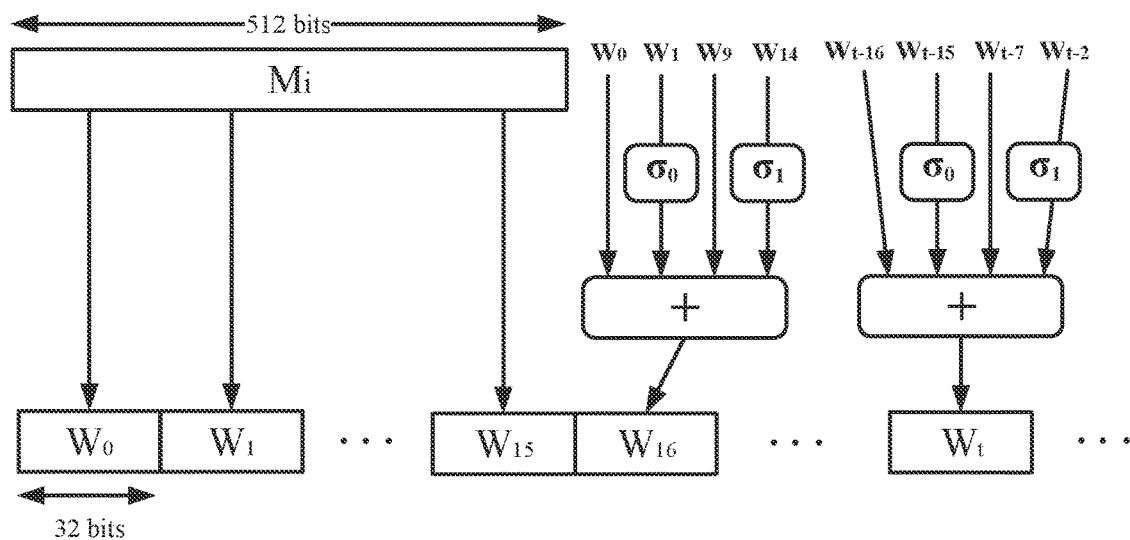
FIG. 4 illustrates a mapping structure for generating Wt.

It is described next how the 32-bit word $W_t$ is derived from a 512-bit data block $M_i$. FIG. 4 illustrates a mapping structure for generating $W_t$. As shown in FIG. 4, $W_t$ is obtained according to the following expression:

For $0 \leq t \leq 15$: $W_t$ is directly taken from the data block $M_i$;
For $16 \leq t \leq 63$:

$$W_t = \sigma_1(W_{t-2}) + W_{t-7} + \sigma_0(W_{t-15}) + W_{t-16} \quad \text{(Expression 2)}$$

wherein:

$$\sigma_0(x) = ROTR^7(x) \oplus ROTR^{18}(x) \oplus SHR^3(x)$$

$$\sigma_1(x) = ROTR^{17}(x) \oplus ROTR^{19}(x) \oplus SHR^{10}(x)$$

wherein, $ROTR^n(x)$ represents circularly right shifting the 32-bit variable x by n bits; $SHR^n(x)$ denotes shifting the 32-bit variable x to the right by n bits, and padding 0 on the left $\oplus$ denotes Exclusive Or operation; + denotes modulo $2^{32}$ addition.

Those skilled in the art will appreciate that the above detailed description of SHA-256 is intended to more clearly present the inventive concepts of the present application and is not intended to be limiting in any way. The SHA-256 discussed herein includes any known version of SHA-256 and variations and modifications thereof.

For multiple rounds of repeated operations in the hash algorithm, a pipeline structure can be adopted to operate multiple sets of different data in parallel so as to improve the operation efficiency. Taking the implementation of the SHA-256 algorithm as an example, since 64 rounds of repeated operations are performed on each 512-bit data block, a 64-stage pipeline structure can be used to operate 64 sets of data in parallel.

Figure 5:
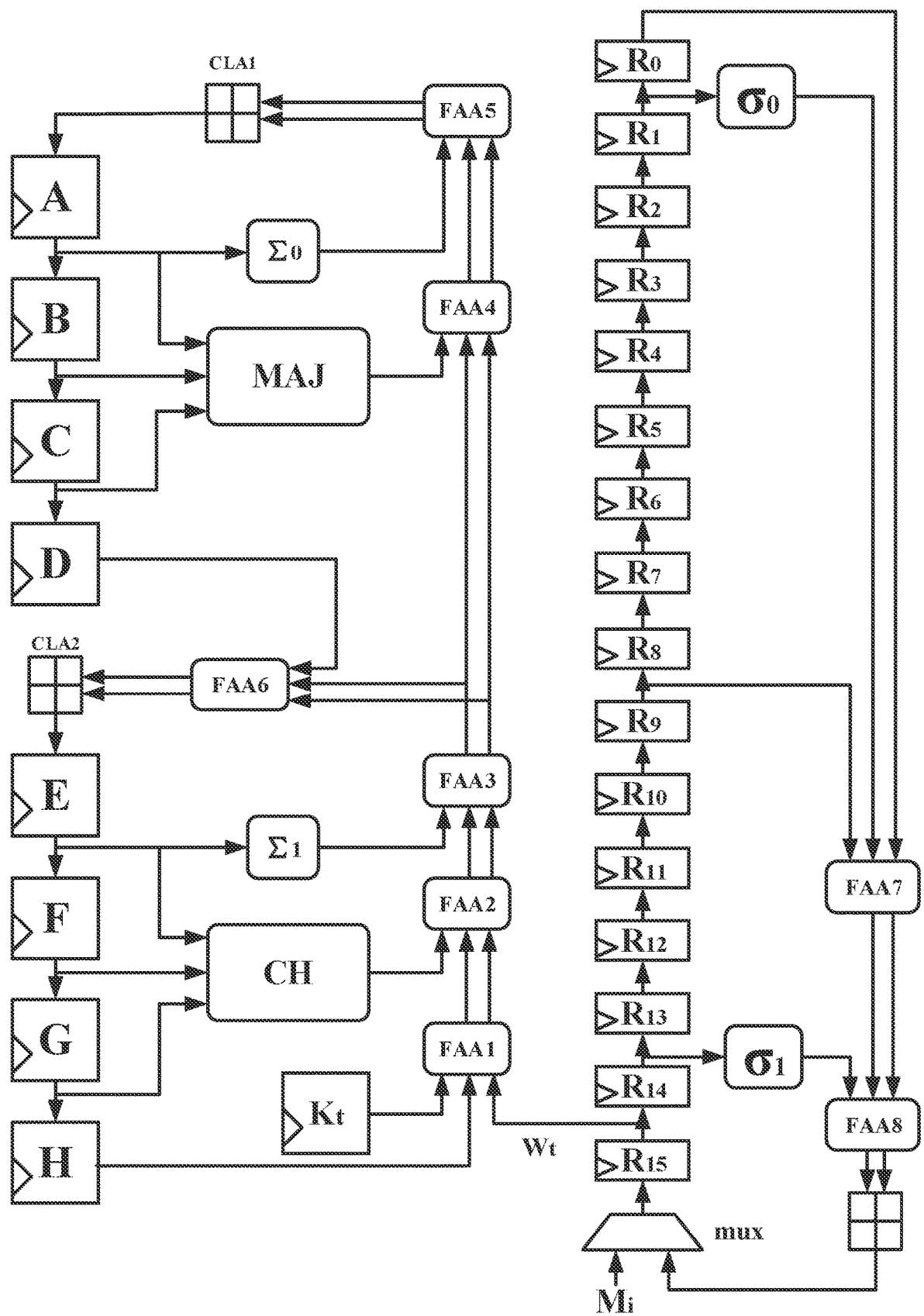
FIG. 5 illustrates an operation schematic diagram of the t-th round of operation performed by one operation stage of a pipeline structure that performs round operations in a circuit for implementing the SHA-256 algorithm.

FIG. 5 illustrates an operation schematic diagram of the round t of operation performed by one operation stage of a pipeline structure that performs round operations in a circuit for implementing the SHA-256 algorithm. Note that FIG. 5 shows operations (including operations of Expressions 1 and 2) to be performed by the operation stage, and does not represent an actual layout placement of the circuit.

As shown in FIG. 5, each operation stage includes 8 32-bit cache register modules A to H for storing intermediate values and 16 32-bit extension register modules $R_0$ to $R_{15}$ for storing extension data $W_t$ to $W_{t+15}$, respectively. Each operation stage also has a plurality of logical operational modules including: full-adder modules FAA1, FAA2, FAA3, FAA4, FAA5, FAA6, FAA7, FAA8, carry-look-ahead adder modules CLA1 and CLA2, an MAJ module for performing the MAJ operation defined in Expression 1, a CH module for performing the CH operation defined in Expression 1, $\Sigma_0$ module for performing the $\Sigma_{operation}$ defined in Expression 1, $\Sigma_1$ module for performing the $\Sigma_1$ operation defined in Expression 1, a $\sigma_0$ module for performing the $\sigma_0$ operation defined in Expression 2, and a $\sigma_1$ module for performing the $\sigma_1$ operation defined in Expression 2.

Figure 6:
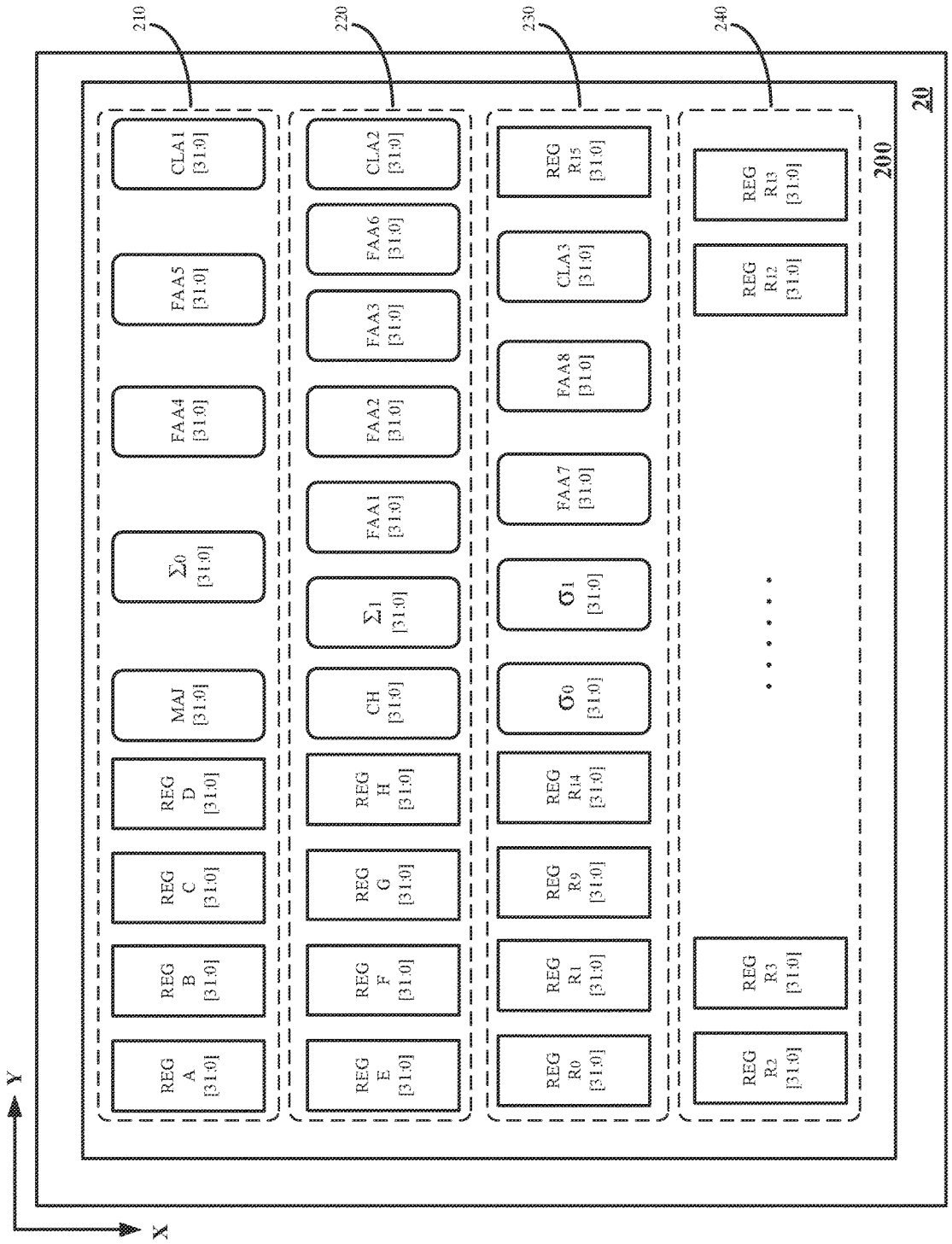
FIG. 6 exemplarily illustrates a schematic structural diagram of a chip 20 placed in a full-custom layout for performing SHA-256 algorithm according to an embodiment of the present disclosure.

FIG. 6 exemplarily illustrates a schematic structural diagram of a chip 20 placed in a full-custom layout for performing the SHA-256 algorithm according to an embodiment of the present disclosure. The chip 20 shown in FIG. 6 is a modified example of the chip 10 shown in FIG. 1A, and the foregoing description about the same or corresponding structure of the chip 10 is applicable to the chip 20. For clarity, only the structure of one operation stage 200 of the pipeline structure is shown in FIG. 6, while other structures are omitted, but those skilled in the art will appreciate that the pipeline structure of the chip 20 may include any number of operation stages, and that the chip 20 may also include any other structures.

The chip 20 is used to implement the SHA-256 algorithm and includes a pipeline structure having a plurality of operation stages, wherein an operation stage 200 is used to implement the operations of a single operation stage as shown in FIG. 5. The operation stage 200 includes a plurality of rows 210, 220, 230, and 240 arranged sequentially in an X-direction parallel to a substrate of the chip and having a uniform row height in the X-direction, wherein rows of a first type include a first row 210, a second row 220, and a third row 230. The first row 210 includes a first set of register modules and a first set of logical operation modules, wherein the first set of register modules of the first row 210 includes 4 32-bit cache register modules A, B, C and D arranged in the form of an array of 1 row and 4 columns, and the first set of logical operation modules of the first row 210 includes a 32-bit MAJ module, a 32-bit $\Sigma_0$ module, a 32-bit FAA4 module, a 32-bit FAA5 module, and a 32-bit CLA1 module arranged in the form of an array of 1 row and 5 columns. The second row 220 includes a first set of register modules and a first set of logical operation modules, wherein the first set of register modules of the second row 220 includes 4 32-bit cache register modules E, F, G and H arranged in the form of an array of 1 row and 4 columns, and the first set of logical operation modules of the second row includes a 32-bit CH module, a 32-bit $\Sigma_1$ module, a 32-bit FAA1 module, a 32-bit FAA2 module, a 32-bit FAA3 module, a 32-bit FAA6 module, and a 32-bit CLA2 module arranged in the form of an array of 1 row and 7 columns. The third row 230 includes a first set of register modules, a first set of logical operation modules, and a fifth set of register modules, wherein the first set of register modules of the third row 230 includes 4 32-bit extension register modules $R_0$, $R_1$, $R_9$, and $R_{14}$ arranged in the form of an array of 1 row and 4 columns, the first set of logical operation modules of the third row includes a 32-bit $\sigma_0$ module, a 32-bit $\sigma_1$ module, a 32-bit FAA7 module, a 32-bit FAA8 module, and a 32-bit CLA3 module arranged in the form of an array of 1 row and 5 columns, and the fifth set of register modules of the third row includes 1 32-bit extension register module $R_{15}$. The plurality of rows of the operation stage 200 further includes a fourth row 240. The fourth row 240 includes a fourth set of modules including 11 32-bit extension register modules $R_2$, $R_3$, $R_4$, $R_5$, $R_6$, $R_7$, $R_8$, $R_{10}$, $R_{11}$, $R_{12}$, $R_{13}$ arranged in the form of an array of 1 row and 11 columns, wherein each of the 32-bit cache register modules A, B, C, D, E, F, G and H is provided, on a side thereof close to the first set of logical operation modules, with 32 1-bit data output ports arranged sequentially in the X-direction and is used to store one 32-bit intermediate value, and each of the 32-bit extension register modules $R_0$ to $R_{15}$ is provided, on a side thereof, with 32 1-bit data output ports arranged sequentially in the X-direction and is used to store one 32-bit extension data. The specific functions of the respective logical operation modules are identical to those shown in FIG. 5, wherein at least part of the modules in the first set of logical operation modules in each row include 32 1-bit operation units arranged sequentially in the X-direction, for example, the FAA1 module includes 32 1-bit full-adder units arranged sequentially in the X-direction. Note that for clarity not all of the modules of the operation stage 200 are shown in FIG. 6, and the operation stage 200 may also include other structures. Those skilled in the art will understand that the arrangement order of the modules in the respective sets of logical operation modules shown in FIG. 6 can be flexibly adjusted according to application requirements, and is not limited to the order shown in FIG. 6.

Figure 7:
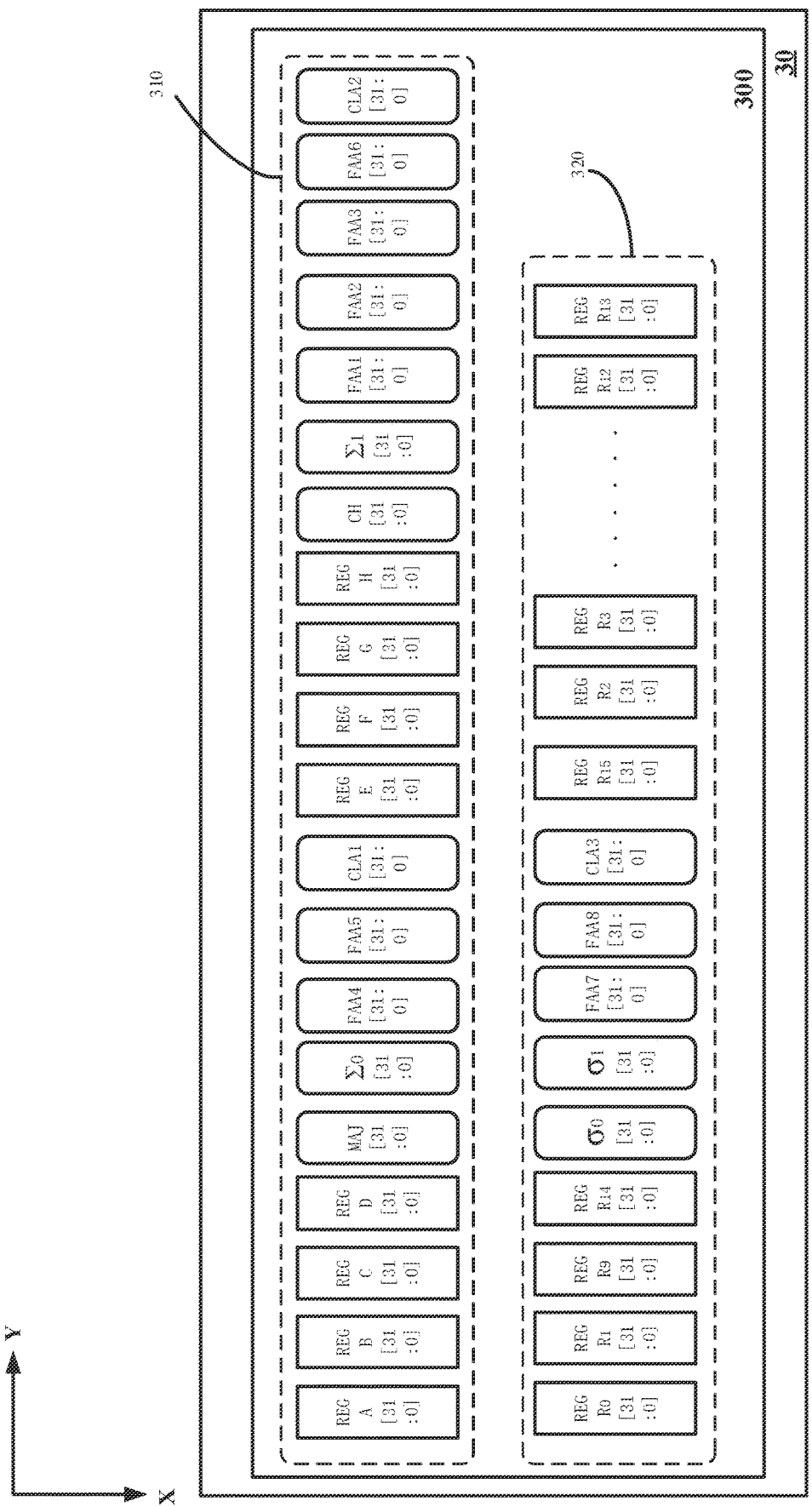
FIG. 7 exemplarily illustrates a schematic structural diagram of a chip 30 placed in a full-custom layout for performing SHA-256 algorithm according to an embodiment of the present disclosure.

FIG. 7 exemplarily illustrates a schematic structural diagram of a chip 30 placed in a full-custom layout for performing the SHA-256 algorithm according to an embodiment of the present disclosure. The chip 30 shown in FIG. 7 is a modified example of the chip 10 shown in FIG. 1A, and the foregoing description about the same or corresponding structure of the chip 10 is applicable to the chip 30. For clarity, only the structure of one operation stage 300 of the pipeline structure is shown in FIG. 7, while other structures are omitted, but those skilled in the art will appreciate that the pipeline structure of the chip 30 may include any number of operation stages 300, and that the chip 30 may also include any desired other structures.

The chip 30 is used to implement the SHA-256 algorithm, and includes a pipeline structure having a plurality of operation stages, wherein an operation stage 300 thereof is used to implement the operation of a single operation stage shown in FIG. 5. The operation stage 300 includes a plurality of rows 310 and 320 arranged sequentially in an X-direction parallel to a substrate of the chip and having a first height in the X-direction, wherein rows of a first type include a first row 310 and a second row 320. The first row 310 includes a first set of register modules, a first set of logical operation modules, a second set of register modules, and a second set of logical operation modules. The first set of register modules of the first row 310 includes 4 32-bit cache register modules A, B, C and D arranged in the form of an array of 1 row and 4 columns, the first set of logical operation modules of the first row 310 includes a 32-bit MAJ module, a 32-bit $\Sigma_0$ module, a 32-bit FAA4 module, a 32-bit FAA5 module, and a 32-bit CLA1 module arranged in the form of an array of 1 row and 5 columns, the second set of register modules of the first row 310 includes 4 32-bit cache register modules E, F, G and H arranged in the form of an array of 1 row and 4 columns, and the second set of logical operation modules of the first row 310 includes a 32-bit CH module, a 32-bit $\Sigma_1$ module, a 32-bit FAA1 module, a 32-bit FAA2 module, a 32-bit FAA3 module, a 32-bit FAA6 module, and a 32-bit CLA2 module arranged in the form of an array of 1 row and 7 columns. The second row 320 includes a first set of register modules, a first set of logical operation modules, a fifth set of register modules, and a fourth set of modules. The first set of register modules of the second row 320 includes 4 32-bit extension register modules $R_0$, $R_1$, $R_9$, and $R_{14}$ arranged in the form of an array of 1 row and 4 columns, the first set of logical operation modules of the second row 320 includes a 32-bit $\sigma_0$ module, a 32-bit $\sigma_1$ module, a 32-bit FAA7 module, a 32-bit FAA8 module, and a 32-bit CLA3 module arranged in the form of an array of 1 row and 5 columns, the fifth set of register modules of the second row 320 includes one 32-bit extension register module $R_{15}$, and the fourth set of modules of the second row includes 11 32-bit extension register modules $R_2$, $R_3$, $R_4$, $R_5$, $R_6$, $R_7$, $R_8$, $R_{10}$, $R_{11}$, $R_{12}$, $R_{13}$ arranged in the form of an array of 1 row and 11 columns, wherein each of the 32-bit cache register modules A, B, C and D is provided, on a side thereof close to the first set of logical operation modules, with 32 1-bit data output ports arranged sequentially in the X-direction and is used for storing one 32-bit intermediate value, each of the 32-bit cache register modules E, F, G and H is provided, on a side thereof close to the second set of logical operation modules, with 32 1-bit data output ports arranged sequentially in the X-direction and is used for storing one 32-bit intermediate value, and each of the 32-bit extension register modules $R_0$ to $R_{15}$ is provided, on a side thereof, with 32 1-bit data output ports arranged sequentially in the X-direction and is used for storing one 32-bit extension data. The specific functions of the respective logical operation modules are identical to those shown in FIG. 5, wherein at least part of the modules in the first set of logical operation modules in each row includes 32 1-bit operation units arranged sequentially in the X-direction, for example, the FAA4 module includes 32 1-bit full-adder units arranged sequentially in the X-direction; and at least part of the modules in the second set of logical operation modules in the first row 310 include 32 1-bit operation units arranged sequentially in the X-direction, e.g., the FAA1 module includes 32 1-bit full-adder units arranged sequentially in the X-direction. Note that for clarity, not all of the modules of the operation stage 300 are shown in FIG. 7, and the operation stage 300 may also include other structures. The arrangement order of the respective modules in the respective sets of logical operation modules shown in FIG. 7 can be flexibly adjusted according to application requirements, and is not limited to the order shown in FIG. 7.

FIG. 8A exemplarily illustrates a schematic structural diagram of a chip 40 placed a full-custom layout for performing the SHA-256 algorithm according to an embodiment of the present disclosure. The chip 40 shown in FIG.

8A is a modified example of the chip 10 shown in FIG. 1A, and the foregoing description about the same or corresponding structure of the chip 10 is applicable to the chip 40. For clarity, only the structure of one operation stage 400 of the pipeline structure is shown in FIG. 8A, while other structures are omitted, but those skilled in the art will appreciate that the pipeline structure of the chip 40 may include any number of operation stages 400, and that the chip 40 may also include any desired other structures.

The chip 40 is used to implement the SHA-256 algorithm and includes a pipeline structure having a plurality of operation stages, wherein an operation stage 400 thereof is used to implement the operation of a single operation stage shown in FIG. 5. The operation stage 400 includes a plurality of rows 410, 420, 430, and 440 arranged sequentially in an X-direction parallel to a substrate of the chip and having a first height in the X-direction, wherein rows of a first type include a first row 410, a second row 420, and a third row 430. The first row 410 includes a first set of register modules and a first set of logical operation modules, wherein the first set of register modules of the first row 410 includes 8 16-bit cache register modules $A_1$, $A_2$, $B_1$, $B_2$, $C_1$, $C_2$, $D_1$, $D_2$ (partially not shown) arranged in the form of an array of 1 row and 8 columns, and the first set of logical operation modules of the first row includes two 16-bit MAJ modules, two 16-bit $\Sigma_0$ modules, and one 32-bit CLA1 module, and so on. The second row 420 includes a first set of register modules and a first set of logical operation modules, wherein the first set of register modules of the second row 420 includes 8 16-bit cache register modules $E_1$, $E_2$, $F_1$, $F_2$, $G_1$, $G_2$, $H_1$, $H_2$ (partially not shown) arranged in the form of an array of 1 row and 8 columns, and the first set of logical operation modules of the second row 420 includes two 16-bit CH modules, two 16-bit $\Sigma_1$ modules and one 32-bit CLA2 module, and so on. The third row 430 includes a first set of register modules, a first set of logical operation modules, and a fifth set of register modules, wherein the first set of register modules of the third row 430 includes 8 16-bit extension register modules $R_{0-1}$, $R_{0-2}$, $R_{1-1}$, $R_{1-2}$, $R_{9-1}$, $R_{9-2}$, $R_{14-1}$, $R_{14-2}$ (partially not shown) arranged in the form of an array of 1 row and 8 columns, the first set of logical operation modules of the third row includes two 16-bit $\sigma_0$ modules, two 16-bit $\sigma_1$ modules, and one 32-bit CLA3 module, and so on, and the fifth set of register modules of the third row includes 2 16-bit extension register modules $R_{15-1}$ and $R_{15-2}$ arranged in the form of an array of 1 row and 2 columns. The plurality of rows of the operation stage 400 may further include a fourth row 440 including a fourth set of modules, which includes 22 16-bit extension register modules $R_{2-1}$, $R_{2-2}$, $R_{3-1}$, $R_{3-2}$, $R_{4-1}$, $R_{4-2}$, $R_{5-1}$, $R_{5-2}$, $R_{6-1}$, $R_{6-2}$, $R_{7-1}$, $R_{7-2}$, $R_{8-1}$, $R_{8-2}$, $R_{10-1}$, $R_{10-2}$, $R_{11-1}$, $R_{11-2}$, $R_{12-1}$, $R_{12-2}$, $R_{13-1}$, $R_{13-2}$ arranged in the form of an array of 1 row and 22 columns. Note that for clarity, not all of the modules of the operation stage 400 are shown in FIG. 8A, and the operation stage may also include other structures. The arrangement order of the respective modules in the respective sets of logical operation modules shown in FIG. 8A can be flexibly adjusted according to application requirements, and is not limited to the order shown in FIG. 8A.

With continued reference to FIG. 8A, every two adjacent 16-bit cache register modules in each row of the first row 410 and the second row 420 are used to collectively store one 32-bit intermediate value, e.g., two adjacent 16-bit cache register modules $A_1$ and $A_2$ in the first row 410 are used to collectively store one 32-bit intermediate value in the round operation as shown in FIG. 5. FIG. 8B illustrates a schematic structural diagram of two adjacent cache register modules $A_1$ and $A_2$, wherein one cache register module $A_1$ is provided, on a side close to the first set of logical operation modules, with 16 1-bit data output ports Out[0], Out[2] up to Out[30] arranged sequentially in the X-direction, and the other cache register module A2 is provided, on a side thereof close to the first set of logical operation modules, with 16 1-bit data output ports Out[1], Out[3] up to Out[31] arranged sequentially in the X-direction.

Every two adjacent 16-bit extension register modules in each row of the third row 430 and the fourth row 440 are used to store one 32-bit extension data, e.g., two adjacent 16-bit extension register modules $R_{0-1}$ and $R_{0-2}$ in the third row 430 are used to store one 32-bit extension data in the round operation as shown in FIG. 5. FIG. 8C illustrates a schematic structural diagram of two adjacent extension register modules $R_{0-1}$ and $R_{0-2}$, wherein one extension register module $R_{0-1}$ is provided, on a side thereof, with 16 1-bit data output ports Out[0], Out[2] up to Out[30] arranged sequentially in the X-direction, and the other extension register module $R_{0-2}$ is provided, on a side thereof, with 16 1-bit data output ports Out[1], Out[3] up to Out[31] arranged sequentially in the X-direction.

The first set of logical operation modules in each of the first row 410, the second row 420, and the third row 430 may include 2 adjacent logical operation modules for collectively processing one or more data having a length of 32 bits, for example, two adjacent 16-bit CH modules in the second row 420 are used for collectively processing three data having a length of 32 bits in accordance with the operations defined in Expression 1. FIG. 8D illustrates a schematic structural diagram of two adjacent 16-bit CH modules. One CH module includes 16 CH operation units CH[0], CH[2] up to CH[30], each of which is for processing three data having a length of 1 bit collectively in accordance with the operations defined in Expression 1, and the 16 CH operation units are arranged sequentially in the X-direction. The other CH module includes 16 CH operation units CH[1], CH[3] up to CH[31], each of which is for processing three data having a length of 1 bit collectively in accordance with the operations defined in Expression 1, and the 16 CH operation units are arranged sequentially in the X-direction.

By comparing the operation stage 200 shown in FIG. 6 with the operation stage 400 shown in FIG. 8A, the overall structure of the operation stage 200 is high and thin, i.e., longer in the X-direction and shorter in the Y-direction, which makes the routing in the X-direction across the respective rows longer and the routing in the Y-direction within the same row shorter in the operation stage 200; the overall structure of the operation stage 400 is short and fat, i.e., shorter in the X-direction and longer in the Y-direction, which makes the routing in the X-direction across the rows shorter and the routing in the Y-direction within the same row longer in the operation stage 400. In application, a more suitable scheme can be selected according to needs. For example, the structure of the operation stage 200 shown in FIG. 6 may be adopted when there are more routings within the same row, while the structure of the operation stage 400 shown in FIG. 8A may be adopted when there are more routings across the respective rows.

Figure 9:
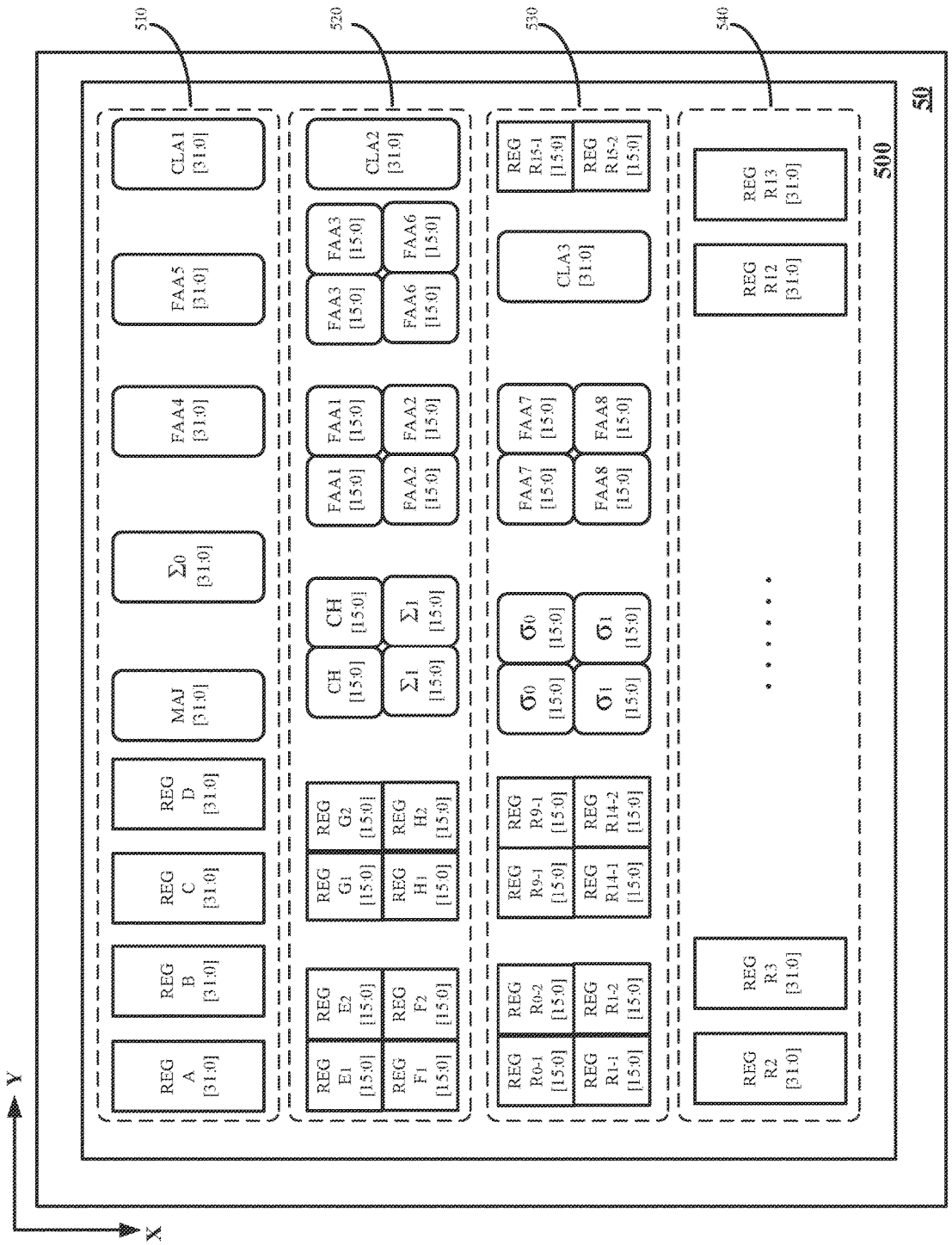
FIG. 9 exemplarily illustrates a schematic structural diagram of a chip 50 placed in a full-custom layout for performing SHA-256 algorithm according to an embodiment of the present disclosure.

FIG. 9 exemplarily illustrates a schematic structural diagram of a chip 50 placed in a full-custom layout for performing the SHA-256 operation according to an embodiment of the present disclosure. The chip 50 shown in FIG. 9 is a modified example of the chip 10 shown in FIG. 1A, and the foregoing description about the same or corresponding structure of the chip 10 is applicable to the chip 50. For clarity, only the structure of one operation stage 500 of the pipeline structure is shown in FIG. 9, while other structures are omitted, but those skilled in the art will appreciate that the pipeline structure of the chip 50 may include any number of operation stages, and that the chip 50 may also include any other structures. The operation stage 500 shown in FIG. 9 can also be regarded as a modified example obtained by combining the operation stage 200 shown in FIG. 6 and the operation stage 400 shown in FIG. 8A. Those skilled in the art will appreciate that the rows of the various types shown in all the embodiments of the present disclosure may be rearranged and combined arbitrarily according to application requirements, under the premise that the row heights of the respective rows are ensured to be consistent.

The chip 50 is used to implement the SHA-256 algorithm and includes a pipeline structure having a plurality of operation stages, wherein an operation stage 500 is used to implement the operation of a single operation stage shown in FIG. 5. The operation stage 500 includes a plurality of rows 510, 520, 530, and 540 arranged sequentially in an X-direction parallel to a substrate of the chip and having a uniform row height in the X-direction, wherein row(s) of a first type include a first row 510. The first row 510 includes a first set of register modules and a first set of logical operation modules, wherein the first set of register modules of the first row 510 includes 4 32-bit cache register modules A, B, C, and D arranged in the form of an array of 1 row and 4 columns, and the first set of logical operation modules of the first row 510 includes a 32-bit MAJ module, a 32-bit $\Sigma_0$ module, a 32-bit FAA4 module, a 32-bit FAA5 module, and a 32-bit CLA1 module arranged in the form of an array of 1 row and 5 columns. The rows of the second type include a second row 520 and a third row 530. The second row 520 includes a third set of register modules and a third set of logical operation modules, wherein the third set of register modules of the second row includes 8 16-bit cache register modules $E_1$, $E_2$, $F_1$, $F_2$, $G_1$, $G_2$, $H_1$, $H_2$ arranged in the form of an array of 2 rows and 4 columns, and the third set of logical operation modules of the second row includes two 16-bit CH modules, two 16-bit $\Sigma_1$ modules, two 16-bit FAA1 modules, two 16-bit FAA2 modules, two 16-bit FAA3 modules, and two 16-bit FAA6 modules arranged in the form of an array of 2 rows and multiple columns. The second row 520 may also include one 32-bit CLA2 module having the row height in the X-direction. The third row 430 includes a third set of register modules, a third set of logical operation modules, and a sixth set of register modules. The third set of register modules of the third row 430 includes 8 16-bit extension register modules $R_{0-1}$, $R_{0-2}$, $R_{1-1}$, $R_{1-2}$, $R_{9-1}$, $R_{9-2}$, $R_{14-1}$, and $R_{14-2}$ arranged in the form of an array of 2 rows and 4 columns, and the third set of logical operation modules of the third row includes two 16-bit $\sigma_0$ modules, two 16-bit $\sigma_1$ modules, two 16-bit FAA7 modules, and two 16-bit FAA8 modules, and so on, arranged in the form of an array of 2 rows and multiple columns. The third row may also include one 32-bit CLA3 module having the row height in the X-direction. The sixth set of register modules of the third row includes 2 16-bit extension register modules $R_{15-1}$ and $R_{15-2}$ arranged in the form of an array of 2 rows and 1 column. The plurality of rows of the operation stage 500 further includes a fourth row 540. The fourth row 540 includes a fourth set of modules, which includes 11 32-bit extension register modules $R_2$, $R_3$, $R_4$, $R_5$, $R_6$, $R_7$, $R_8$, $R_{10}$, $R_{11}$, $R_{12}$, $R_{13}$ arranged in the form of an array of 1 row and 11 columns.

With continued reference to FIG. 9, each 32-bit cache register module is used to store one 32-bit intermediate value, and each 32-bit extension register module is used to store one 32-bit extension data. Every two 16-bit cache register modules arranged sequentially in the Y-direction in the second row 520 are used to collectively store one 32-bit intermediate value, for example, two adjacent 16-bit cache register modules $E_1$ and $E_2$ in the second row 520 are used to collectively store one 32-bit intermediate value in the round operation as shown in FIG. 5. Every two 16-bit extension register modules arranged sequentially in the Y-direction in the third row 530 are used to collectively store one 32-bit extension data. For example, two adjacent 16-bit extension register modules $R_{0-1}$ and $R_{0-2}$ in the third row 530 are used to collectively store one 32-bit extension data in the round operation as shown in FIG. 5. The third set of logical operation modules in each row of the second row 520 and the third row 530 may include 2 adjacent logical operation modules for collectively processing one or more data having a length of 32 bits, for example, two adjacent 16-bit CH modules in the second row 520 are used for collectively processing three data having a length of 32 bits in accordance with the operations defined in Expression 1. Note that for clarity not all of the modules of the operation stage 500 are shown in FIG. 9, and the operation stage 500 may also include other structures. Those skilled in the art will understand that the arrangement order of the respective modules in the respective sets of logical operation modules shown in FIG. 9 can be flexibly adjusted according to application requirements, and is not limited to the order shown in FIG. 9.

Figure 10:
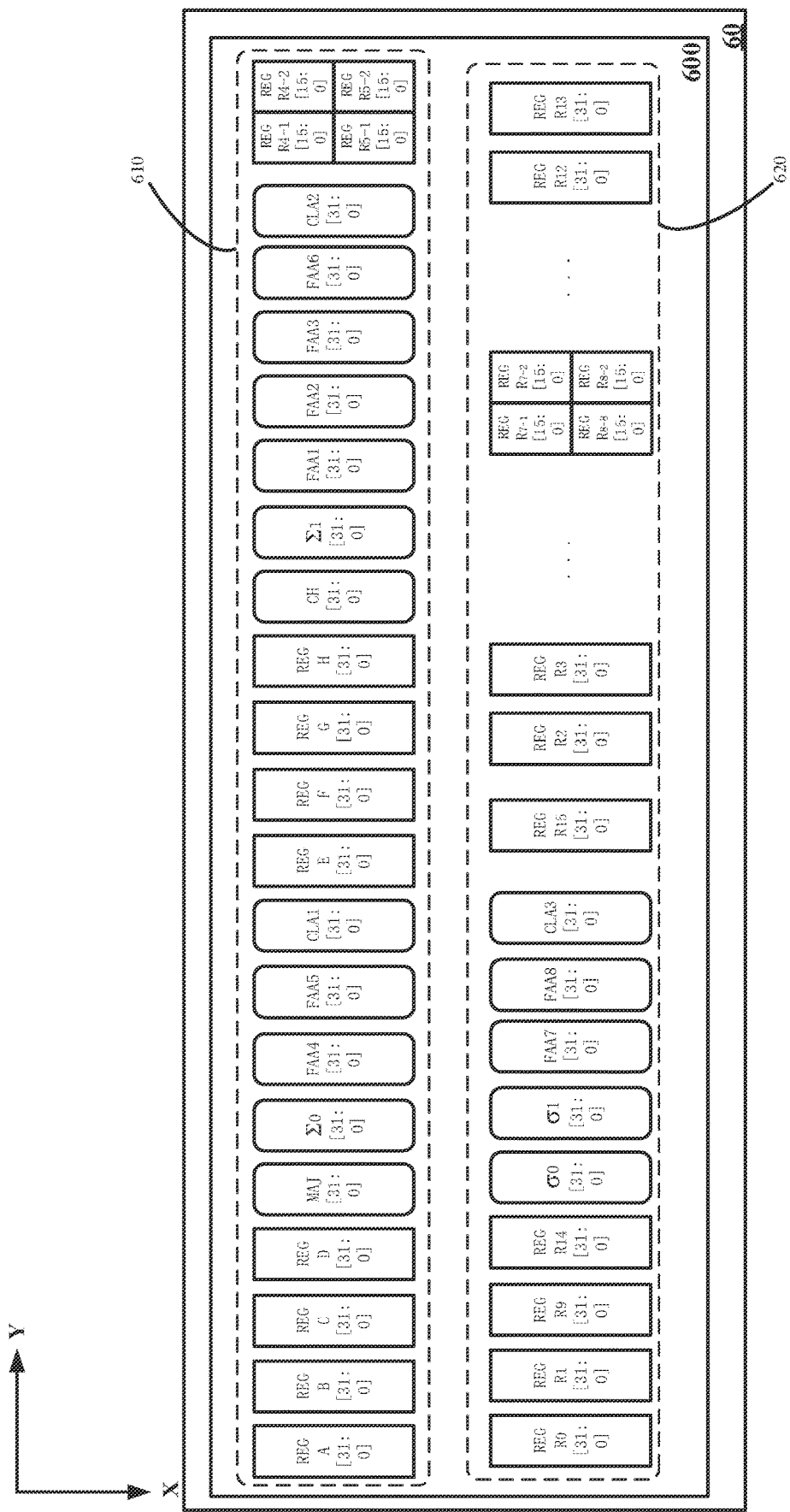
FIG. 10 exemplarily illustrates a schematic structural diagram of a chip 60 placed in a full-custom layout for performing SHA-256 algorithm according to an embodiment of the present disclosure.

FIG. 10 exemplarily illustrates a schematic structural diagram of a chip 60 placed in a full-custom layout for performing the SHA-256 operation according to an embodiment of the present disclosure. The chip 60 shown in FIG. 10 is a modified example of the chip 10 shown in FIG. 1, and the foregoing description about the same or corresponding structure of the chip 10 is applicable to the chip 60. For clarity, only the structure of one operation stage 600 of the pipeline structure is shown in FIG. 10, while other structures are omitted, but those skilled in the art will appreciate that the pipeline structure of the chip 60 may include any number of operation stages 600, and that the chip 60 may also include any desired other structures.

The chip 60 is used to implement the SHA-256 algorithm and includes a pipeline structure having a plurality of operation stages, wherein an operation stage 600 is used to implement the operation of a single operation stage shown in FIG. 5. The operation stage 600 includes a plurality of rows 610 and 620 arranged sequentially in an X-direction parallel to a substrate of the chip and having a first height in the X-direction, wherein rows of a first type include a first row 610 and a second row 620. The first row 610 includes a first set of register modules, a first set of logical operation modules, a second set of register modules, a second set of logical operation modules, and a fourth set of modules. The first set of register modules of the first row 610 includes 4 32-bit cache register modules A, B, C and D arranged in the form of an array of 1 row and 4 columns, the first set of logical operation modules of the first row 610 includes a 32-bit MAJ module, a 32-bit $\Sigma_0$ module, a 32-bit FAA4 module, a 32-bit FAA5 module, and a 32-bit CLA1 module arranged in the form of an array of 1 row and 5 columns, the second set of register modules of the first row 610 includes 4 32-bit cache register modules E, F, G and H arranged in the form of an array of 1 row and 4 columns, the second set of logical operation modules of the first row 610 includes a 32-bit CH module, a 32-bit $\Sigma_1$ module, a 32-bit FAA1 module, a 32-bit FAA2 module, a 32-bit FAA3 module, a 32-bit FAA6 module, and a 32-bit CLA2 module arranged in the form of an array of 1 row and 7 columns, and the fourth set of register modules of the first row 610 includes 4 16-bit extension register modules $R_{4-1}$, $R_{4-2}$, $R_{5-1}$ and $R_{5-2}$ arranged in the form of an array of 2 rows and 2 columns.

The second row 620 includes a first set of register modules, a first set of logical operation modules, a fifth set of register modules, and a fourth set of modules. The first set of register modules of the second row 620 includes 4 32-bit extension register modules $R_0$, $R_1$, $R_9$, and $R_{14}$ arranged in the form of an array of 1 row and 4 columns. The first set of logical operation modules of the second row 620 includes a 32-bit $\sigma_0$ module, a 32-bit $\sigma_1$ module, a 32-bit FAA7 module, a 32-bit FAA8 module, and a 32-bit CLA3 module arranged in the form of an array of 1 row and 5 columns. The fifth set of register modules of the second row 620 includes 1 32-bit extension register module $R_{15}$, and the fourth set of modules of the second row 620 includes 4 16-bit extension register modules $R_{7-1}$, $R_{7-2}$, $R_{8-1}$ and $R_{8-2}$ arranged in the form of an array of 2 rows and 2 columns. The respective rows of the operation stage 600 may also include other structures than those module described above, for example, the second row 620 may also include 32-bit extension register modules $R_2$, $R_3$, $R_6$, $R_{10}$ to $R_{13}$. Each of the 32-bit cache register modules A, B, C and D is provided, on a side thereof close to the first set of logical operation modules, with 32 1-bit data output ports arranged sequentially in the X-direction and is used for storing one 32-bit intermediate value. Each of the 32-bit cache register modules E, F, G and H is provided, on a side thereof close to the second set of logical operation modules, with 32 1-bit data output ports arranged sequentially in the X-direction and is used for storing one 32-bit intermediate value. Each of the 32-bit extension register modules $R_0$ to $R_3$, $R_6$, $R_9$ to $R_{15}$ is provided, on a side thereof, with 32 1-bit data output ports arranged sequentially in the X-direction and is used to store one 32-bit extension data. Each of the 16-bit extension register modules $R_{4-1}$, $R_{4-2}$, $R_{5-1}$, $R_{5-2}$, $R_{7-1}$, $R_{7-2}$, $R_{8-1}$, and $R_{8-2}$ is provided, on a side thereof, with 16 1-bit data output ports arranged sequentially in the X-direction, and every two adjacent 16-bit extension register modules arranged sequentially in the Y-direction in the fourth set of modules in each row of the first row 610 and the second row 620 are used to collectively store one 32-bit extension data. For example, two 16-bit extension register modules $R_{4-1}$ and $R_{4-2}$ adjacent in the Y-direction in the first row 610 are used to collectively store one 32-bit extension data. The specific functions of the respective logical operation modules in FIG. 10 are identical to that shown in FIG. 5, wherein at least part of the modules in the first set of logical operation modules in each of the first row 610 and the second row 620 include 32 1-bit operation units arranged sequentially in the X-direction, for example, the FAA4 module includes 32 1-bit full-adder units arranged sequentially in the X-direction. At least part of the modules in the third set of logical operation modules in the first row 610 include 32 1-bit operation units arranged sequentially in the X-direction, for example, the FAA1 module includes 32 1-bit full-adder units arranged sequentially in the X-direction. Note that for clarity, not all of the modules of the operation stage 600 are shown in FIG. 10, and the operation stage 600 may also include other structures.

With respect to the definitions of the first set of register modules, the first set of logical operation modules, the second set of register modules, the second set of logical operation modules, the third set of register modules, and the third set of logical operation modules in the present disclosure, some supplementary explanations are made herein to facilitate understanding by those skilled in the art. Note that the explanations herein are merely for aiding understanding and are not intended to constitute additional limitations. In one operation stage of a pipeline structure that adopts the technical solution of the present disclosure, if a certain row includes a set of register modules provided in a matrix form and a set of logical operation modules adjacent thereto, which is provided in a matrix form and used for processing data in the set of register modules, and the numbers of rows of the two sets of modules are identical, then the set of register modules and the set of logical operation modules can be respectively identified as a first set of register modules and a first set of logical operation modules, wherein the number of rows of the first set of register modules is identified as a, the number of columns of the first set of register modules is identified as b, the number of columns of the first set of logical operation modules is identified as c, and the row is identified as a row of a first type. In the operation stage, if any other row also includes several modules that conform to the definitions of the first set of register modules and the first set of logical operation modules, that row may also be identified as a row of the first type, and the corresponding modules may also be identified as the first set of register modules and the first set of logical operation modules. If the certain row of the first type of the operation stage, in addition to the first set of register modules and the first set of logical operation modules, includes another set of register modules provided in a matrix form and another set of logical operation modules adjacent thereto, which is provided in a matrix form and used for processing data in the other set of register modules, and the number of rows of the two sets of modules are identical, then the other set of register modules and the other set of logical operation modules can be identified as a second set of register modules and a second set of logical operation modules, wherein the number of rows of the second set of register modules is identified as d, the number of columns of the second set of register modules is identified as e, and the number of columns of the second set of logical operation modules is identified as f. If a certain row of the operation stage includes a set of register modules provided in a matrix form and a set of logical operation modules adjacent thereto, which is provided in a matrix form and used for processing data in the set of register modules, and the number of rows of the two sets of modules are identical, but the set of register modules and the set of logical operation modules do not conform to the definitions of the first set of register modules and the first set of logical operation modules (e.g. the set of register modules is not of a rows and b columns, or the set of logical operation modules is not of a rows and c columns, or the like), then the set of register modules and the set of logical operation modules may be respectively identified as a third set of register modules and a third set of logical operation modules, wherein the number of rows of the third set of register modules is identified as g, the number of columns of the third set of register modules is identified as h, the number of columns of the third set of logical operation modules is identified as i, and the row is identified as a row of a second type.

There is also provided, in accordance with an embodiment of the present disclosure, an electronic device for implementing a mining algorithm, which comprises the chip placed in a full-custom layout as described hereinbefore, including but not limited to chip 10, chip 20, chip 30, chip 40, chip 50, and chip 60.

In the embodiments shown and discussed here, any specific value shall be interpreted as only illustrative, instead of limitative. Hence, other embodiments of the illustrative embodiments may have different values.

The terms "front", "back", "top", "bottom", "over", "under" and the like in the description and in the claims, if any, are used for descriptive purposes and not necessarily for describing constant relative positions. It is to be understood that the terms thus used are interchangeable under appropriate circumstances such that the embodiments of the disclosure as described herein are, for example, capable of being operated in other orientations different than those as illustrated or otherwise described herein.

As used herein, the word "exemplary" means "serving as an example, instance, or illustration", instead of serving as a "model" that is to be accurately reproduced. Any implementation illustratively described herein is not necessarily to be construed as preferred or advantageous over other implementations. Furthermore, the present disclosure is not limited by any expressed or implied theory presented in the preceding parts of Technical Field, Background Art, Contents of the Invention or Embodiment.

As used herein, the term "substantially" is intended to encompass any minor variation caused by design or manufacturing imperfections, tolerances of devices or components, environmental influences, and/or other factors. The word "substantially" also allows for differences from a perfect or ideal situation due to parasitic effects, noise, and other practical considerations that may exist in a practical implementation.

The above description may indicate elements or nodes or features that are "connected" or "coupled" together. As used herein, the term "connecting" means one element/node/feature is electronically, mechanically, logically or otherwise directly connected (or directly communicates) with another element/node/feature, unless otherwise explicitly illustrated. Similarly, unless otherwise explicitly illustrated, the term "coupling" means one element/node/feature may be mechanically, electronically, logically or otherwise linked to another element/node/feature in a directly or indirect manner to allow an interaction therebetween, even if these two features may not be connected directly. In other words, the term "coupling" intends to include direct links and indirect links between elements or other features, including connections through one or more intermediate elements.

It will be further understood that the term "comprising/including", when used herein, specifies the presence of stated features, integers, steps, operations, units and/or components, but the presence or addition of one or more other features, integers, steps, operations, units and/or components, and/or combinations thereof are not excluded.

It shall be realized by those skilled in the art that boundaries between said operations are only illustrative. Multiple operations may be combined into a single operation, and a single operation may be distributed in additional operations, and moreover, the operations may be performed in an at least partially overlapping manner in time. Furthermore, optional embodiments may include multiple examples of specific operations, and the operation sequence may be changed in various other embodiments. However, other modifications, changes and replacements are also possible. Thus, the description and drawings shall be deemed as illustrative instead of limitative.

Although some specific embodiments of the present disclosure have been illustrated by ways of examples in detail, it shall be understood by those skilled in the art that the above examples are only illustrative, but shall by no means limit the scope of the present disclosure. The respective examples disclosed here may be combined in any manner, without departure from spirits and scope of the present disclosure. It shall further be understood by those skilled in the art that multiple amendments may be made to the examples, without departure from the scope and spirits of the present disclosure. The scope of the present disclosure is defined by the attached claims.

What is claimed is:

1. A chip placed in a full-custom layout, comprising a pipeline structure having a plurality of operation stages, wherein each operation stage includes:
   a plurality of rows arranged sequentially in an X-direction parallel to a substrate of the chip and having a uniform row height in the X-direction, the plurality of rows including rows of a first type, each row of the first type including:
   a first set of register modules, including a*b register modules arranged in the form of an array of a rows and b columns, wherein each register module has a first height in the X-direction, and the row height is a times of the first height, where a and b are positive integers; and
   a first set of logical operation modules, including a*c logical operation modules arranged in the form of an array of a rows and c columns, wherein each logical operation module has the first height in the X-direction, where c is a positive integer;
   wherein the first set of register modules and the first set of logical operation modules are adjacently provided in a Y-direction, and the first set of logical operation modules is used for processing data in the first set of register modules.

2. The chip according to claim 1, wherein:
   each register module in the first set of register modules is a p-bit register module, and is provided, on a side thereof close to the first set of logical operation modules, with p 1-bit data output ports arranged sequentially in the X-direction, where p is a positive integer;
   the first set of register modules includes q register modules arranged sequentially in the Y-direction for collectively storing one data of p*q bits, where q is a positive integer;
   each of at least part of the logical operation modules in the first set of logical operation modules includes p 1-bit operation units arranged sequentially in the X-direction; and
   the at least part of the logical operation modules in the first set of logical operation modules include q logical operation modules arranged sequentially in the Y-direction for collectively processing one or more data having a length of p*q bits.

3. The chip according to claim 2, wherein at least one of the rows of the first type further includes:
   a second set of register modules, including d*e register modules arranged in the form of an array of d rows and e columns, wherein each register module has a second height in the X-direction, and the row height is d times of the second height, where d and e are positive integers; and
   a second set of logical operation modules, including d*f logical operation modules arranged in the form of an array of d rows and f columns, wherein each logical operation module has the second height in the X-direction, where f is a positive integer,
   wherein the second set of register modules and the second set of logical operation modules are adjacently provided in the Y-direction, and the second set of logical operation modules is used for processing data in the second set of register modules.

4. The chip according to claim 3, wherein:
each register module in the second set of register modules is an r-bit register module, and is provided, on a side thereof close to the second set of logical operation modules, with r 1-bit data output ports arranged sequentially in the X-direction, where r is a positive integer and satisfies a*p=d*r;
the second set of register modules includes s register modules arranged sequentially in the Y-direction for collectively storing one data of r*s bits, where s is a positive integer;
each of at least part of the logical operation modules in the second set of logical operation modules includes r 1-bit operation units arranged sequentially in the X-direction; and
the at least part of the logical operation modules in the second set of logical operation modules include s logical operation modules arranged sequentially in the Y-direction for collectively processing one or more data having a length of r*s bits.

5. The chip according to claim 2, wherein the plurality of rows includes rows of a second type, each row of the second type including:
a third set of register modules, including g*h register modules arranged in the form of an array of g rows and h columns, wherein each register module has a third height in the X-direction, and the row height is g times of the third height, where g and h are positive integers; and
a third set of logical operation modules, including g*i logical operation modules arranged in the form of an array of g rows and i columns, wherein each logical operation module has the third height in the X-direction, where i is a positive integer;
wherein the third set of register modules and the third set of logical operation modules are adjacently provided in the Y-direction, and the third set of logical operation modules is used for processing data in the third set of register modules.

6. The chip according to claim 5, wherein:
each register module in the third set of register modules is a t-bit register module, and is provided, on a side thereof close to the third set of logical operation modules, with t 1-bit data output ports arranged sequentially in the X-direction, where t is a positive integer and satisfies a*p=g*t;
the third set of register modules includes u register modules arranged sequentially in the Y-direction for collectively storing one data of t*u bits, where u is a positive integer;
each of at least part of the logical operation modules in the third set of logical operation modules includes t 1-bit operation units arranged sequentially in the X-direction; and
the at least part of the logical operation modules in the third set of logical operation modules include u logical operation modules arranged sequentially in the Y-direction for collectively processing one or more data having a length of t*u bits.

7. The chip according to claim 1, wherein at least one of the plurality of rows includes:
a fourth set of modules, including j*k modules arranged in the form of an array of j rows and k columns, wherein each module is a register module or a logical operation module and has a fourth height in the X-direction, and the row height is j times of the fourth height, where j and k are positive integers.

8. The chip according to claim 7,
wherein at least one of the rows of the first type further includes:
a fifth set of register modules, including a*m register modules arranged in the form of an array of a rows and m columns, wherein each register module has the first height in the X-direction, where m is a positive integer;
wherein the first set of logical operation modules and the fifth set of register modules are adjacently provided in the Y-direction, and the fifth set of register modules is used to store the data processed by the first set of logical operation modules; and/or
wherein at least one of the rows of the second type further includes:
a sixth set of register modules, including g*n register modules arranged in the form of an array of g rows and n columns, wherein each register module has the third height in the X-direction, where n is a positive integer;
wherein the third set of logical operation modules and the sixth set of register modules are adjacently provided in the Y-direction, and the sixth set of register modules is used to store the data processed by the third set of logical operation modules.

9. The chip according to claim 8, wherein:
the chip is used for implementing SHA-256 algorithm;
the rows of the first type of each operation stage include a first row, a second row, and a third row, wherein:
the first row includes a first set of register modules and a first set of logical operation modules, the first set of register modules of the first row including 4 32-bit cache register modules A, B, C and D arranged in the form of an array of 1 row and 4 columns,
the second row includes a first set of register modules and a first set of logical operation modules, the first set of register modules of the second row including 4 32-bit cache register modules E, F, G and H arranged in the form of an array of 1 row and 4 columns, and
the third row includes a first set of register modules, a first set of logical operation modules and a fifth set of register modules, the first set of register modules of the third row including 4 32-bit extension register modules $R_0$, $R_1$, $R_9$, and $R_{14}$ arranged in the form of an array of 1 row and 4 columns, the fifth set of register modules of the third row including 1 32-bit extension register module $R_{15}$;
the plurality of rows of each operation stage further include a fourth row including a fourth set of modules, the fourth set of modules of the fourth row including 11 32-bit extension register modules $R_2$, $R_3$, $R_4$, $R_5$, $R_6$, $R_7$, $R_8$, $R_{10}$, $R_{11}$, $R_{12}$, $R_{13}$ arranged in the form of an array of 1 row and 11 columns; and
each 32-bit cache register module is used to store one 32-bit intermediate value, and each 32-bit extension register module is used to store one 32-bit extension data.

10. The chip according to claim 8, wherein:
the chip is used for implementing SHA-256 algorithm;
the rows of the first type of each operation stage include a first row and a second row, wherein:
the first row includes a first set of register modules, a first set of logical operation modules, a second set of register modules, and a second set of logical operation modules, wherein the first set of register modules of the first row includes 4 32-bit cache register modules A, B, C and D arranged in the form of an array of 1 row and 4 columns, and the second set of register modules of the first row includes 4 32-bit cache register modules E, F, G and H arranged in the form of an array of 1 row and 4 columns;

the second row includes a first set of register modules, a first set of logical operation modules, a fifth set of register modules and a fourth set of modules, wherein the first set of register modules of the second row includes 4 32-bit extension register modules $R_0$, $R_1$, $R_9$ and $R_{14}$ arranged in the form of an array of 1 row and 4 columns, the fifth set of register modules of the second row includes one 32-bit extension register module $R_{15}$, and the fourth set of modules of the second row includes 11 32-bit extension register modules $R_2$, $R_3$, $R_4$, $R_5$, $R_6$, $R_7$, $R_8$, $R_{10}$, $R_{11}$, $R_{12}$, $R_{13}$ arranged in the form of an array of 1 row and 11 columns; and each 32-bit cache register module is used to store one 32-bit intermediate value, and each 32-bit extension register module is used to store one 32-bit extension data.

11. The chip according to claim 8, wherein:

the chip is used for implementing SHA-256 algorithm;

the rows of the first type of each operation stage include a first row, a second row and a third row, wherein:

the first row includes a first set of register modules and a first set of logical operation modules, the first set of register modules of the first row including 8 16-bit cache register modules $A_1$, $A_2$, $B_1$, $B_2$, $C_1$, $C_2$, $D_1$ and $D_2$ arranged in the form of an array of 1 row and 8 columns, the second row includes a first set of register modules and a first set of logical operation modules, the first set of register modules of the second row including 8 16-bit cache register modules $E_1$, $E_2$, $F_1$, $F_2$, $G_1$, $G_2$, $H_1$, $H_2$ arranged in the form of an array of 1 row and 8 columns, and the third row includes a first set of register modules, a first set of logical operation modules and a fifth set of register modules, the first set of register modules of the third row including 8 16-bit extension register modules $R_{0-1}$, $R_{0-2}$, $R_{1-1}$, $R_{1-2}$, $R_{9-1}$, $R_{9-2}$, $R_{14-1}$ and $R_{14-2}$ arranged in the form of an array of 1 row and 8 columns, the fifth set of register modules of the third row including 2 16-bit extension register modules $R_{15-1}$ and $R_{15-2}$ arranged in the form of an array of 1 row and 2 columns;

the plurality of rows of each operation stage further include a fourth row including a fourth set of modules, the fourth set of modules of the fourth row including 22 16-bit extension register modules $R_{2-1}$, $R_{2-2}$, $R_{3-1}$, $R_{3-2}$, $R_{4-1}$, $R_{4-2}$, $R_{5-1}$, $R_{5-2}$, $R_{6-1}$, $R_{6-2}$, $R_{7-1}$, $R_{7-2}$, $R_{8-1}$, $R_{8-2}$, $R_{10-1}$, $R_{10-2}$, $R_{11-1}$, $R_{11-2}$, $R_{12-1}$, $R_{12-2}$, $R_{13-1}$, $R_{13-2}$ arranged in the form of an array of 1 row and 22 columns; and every two adjacent 16-bit cache register modules in each of the first and second rows are used to collectively store one 32-bit intermediate value, every two adjacent 16-bit extension register modules in each of the third and fourth rows are used to collectively store one 32-bit extension data, and the first set of logical operation modules in each of the first, second, and third rows includes 2 logical operation modules adjacent to each other in the Y-direction that are used to collectively process one or more data having a length of 32 bits.

12. The chip according to claim 8, wherein:

the chip is used for implementing SHA-256 algorithm;

the rows of the first type of each operation stage include a first row, wherein:

the first row includes a first set of register modules and a first set of logical operation modules, the first set of register modules of the first row including 4 32-bit cache register modules A, B, C and D arranged in the form of an array of 1 row and 4 columns;

the rows of the second type of each operation stage include a second row and a third row, wherein:

the second row includes a third set of register modules and a third set of logical operation modules, the third set of register modules of the second row including 8 16-bit cache register modules $E_1$, $E_2$, $F_1$, $F_2$, $G_1$, $G_2$, $H_1$, $H_2$ arranged in the form of an array of 2 rows and 4 columns, the third row includes a third set of register modules, a third set of logical operation modules and a sixth set of register modules, the third set of register modules of the third row including 8 16-bit extension register modules $R_{0-1}$, $R_{0-2}$, $R_{1-1}$, $R_{1-2}$, $R_{9-1}$, $R_{9-2}$, $R_{14-1}$ and $R_{14-2}$ arranged in the form of an array of 2 rows and 4 columns, the sixth set of register modules of the third row including 2 16-bit extension register modules $R_{15-1}$ and $R_{15-2}$ arranged in the form of an array of 2 rows and 1 column;

the plurality of rows of each operation stage further include a fourth row including a fourth set of modules, the fourth set of modules of the fourth row including 11 32-bit extension register modules $R_2$, $R_3$, $R_4$, $R_5$, $R_6$, $R_7$, $R_8$, $R_{10}$, $R_{11}$, $R_{12}$, $R_{13}$ arranged in the form of an array of 1 row and 11 columns;

each 32-bit cache register module is used to store one 32-bit intermediate value, each 32-bit extension register module is used to store one 32-bit extension data, every two adjacent 16-bit cache register modules in the second row that are provided sequentially in the Y-direction are used to collectively store one 32-bit intermediate value, every two adjacent 16-bit extension register modules in the third row that are provided sequentially in the Y-direction are used to collectively store one 32-bit extension data, and the third set of logical operation modules in each of the second and third rows includes 2 logical operation modules adjacent to each other in the Y-direction that are used to collectively process one or more data having a length of 32 bits.

13. The chip according to claim 8, wherein:

the chip is used for implementing SHA-256 algorithm;

the rows of the first type of each operation stage include a first row and a second row, wherein:

the first row includes a first set of register modules, a first set of logical operation modules, a second set of register modules, a second set of logical operation modules, and a fourth set of modules, wherein the first set of register modules of the first row includes 4 32-bit cache register modules A, B, C and D arranged in the form of an array of 1 row and 4 columns, the second set of register modules of the first row includes 4 32-bit cache register modules E, F, G and H arranged in the form of an array of 1 row and 4 columns, and the fourth set of modules of the first row includes 4 16-bit extension register modules arranged in the form of an array of 2 rows and 2 columns;

the second row includes a first set of register modules, a first set of logical operation modules, a fifth set of register modules and a fourth set of modules, wherein the first set of register modules of the second row includes 4 32-bit extension register modules $R_0$, $R_1$, $R_9$ and $R_{14}$ arranged in the form of an array of 1 row and 4 columns, the fifth set of register modules of the second row includes one 32-bit extension register module $R_{15}$, and the fourth set of modules of the second row includes 4 16-bit extension register modules arranged in the form of an array of 2 rows and 2 columns; and each 32-bit cache register module is used to store one 32-bit intermediate value, each 32-bit extension register module is used to store one 32-bit extension data, and every two 16-bit extension register modules, provided sequentially in the Y-direction, in the fourth set of modules in each of the first and second rows are used to collectively store one 32-bit extension data.

14. An electronic device for implementing a mining algorithm, characterized by comprising the chip placed in a full-custom layout according to claim 1.

* * * * *